United States Patent
Nakayama et al.

(10) Patent No.: US 10,386,392 B2
(45) Date of Patent: Aug. 20, 2019

(54) HALL ELEMENT DRIVING CIRCUIT, SENSOR CIRCUIT, AND CURRENT MEASURING APPARATUS

(71) Applicant: HIOKI DENKI KABUSHIKI KAISHA, Nagano (JP)

(72) Inventors: Atsushi Nakayama, Nagano (JP); Masakazu Ikeda, Nagano (JP); Youhei Sakurai, Nagano (JP)

(73) Assignee: HIOKI DENKI KABUSHIKI KAISHA, Nagano (JP)

( * ) Notice: Subject to any disclaimer, the term of this patent is extended or adjusted under 35 U.S.C. 154(b) by 543 days.

(21) Appl. No.: 15/001,426

(22) Filed: Jan. 20, 2016

(65) Prior Publication Data

US 2016/0216296 A1 Jul. 28, 2016

(30) Foreign Application Priority Data

Jan. 28, 2015 (JP) .................................. 2015-14571
Mar. 19, 2015 (JP) .................................. 2015-55636

(51) Int. Cl.
*G01R 15/20* (2006.01)
*G01R 35/00* (2006.01)
*G01R 19/25* (2006.01)

(52) U.S. Cl.
CPC ........ *G01R 15/202* (2013.01); *G01R 19/2506* (2013.01)

(58) Field of Classification Search
CPC .......................... G01R 15/202; G01R 19/2506
See application file for complete search history.

(56) References Cited

U.S. PATENT DOCUMENTS 5,621,319 A  4/1997  Bilotti et al.
9,134,349 B2  9/2015  Hu et al.
(Continued)

FOREIGN PATENT DOCUMENTS

CN  101782634 A  7/2010
CN  101813757 A  8/2010
(Continued)

OTHER PUBLICATIONS

First Office Action in Chinese Patent Application No. 201610055071.0, dated Mar. 1, 2019, from the State Intellectual Property Office of People's Republic of China (including English language translation).

*Primary Examiner* — Huy Q Phan
*Assistant Examiner* — Zannatul Ferdous
(74) *Attorney, Agent, or Firm* — Greenblum & Bernstein, P.L.C.

(57) ABSTRACT

A Hall element driving circuit includes: a signal switching unit which is disposed between a power supply, which outputs a current, and a Hall element having first and second terminals and performs switching control between a first switching state that supplies the current to the first terminals and a second switching state that supplies the current to the second terminals; a switching control unit that controls transitions between the first switching state and the second switching state; and a switching unit that is disposed between the power supply and the signal switching unit and controls switching between an on state where the current is supplied and an off state where the current is stopped. The switching control unit controls transitions between the on and off states and executes switching control over the signal switching unit only when the switching unit is in the off state.

2 Claims, 12 Drawing Sheets

(56) References Cited

U.S. PATENT DOCUMENTS

| | | | |
|---|---|---|---|
| 9,316,702 B2 | 4/2016 | Komatsu et al. | |
| 2010/0213932 A1* | 8/2010 | Utsunomiya | G01R 33/0035 324/251 |
| 2014/0145714 A1* | 5/2014 | Okatake | G01R 33/07 324/225 |
| 2014/0200735 A1* | 7/2014 | Berglund | G06F 19/00 701/1 |
| 2014/0210462 A1* | 7/2014 | Yamamoto | G01R 33/07 324/251 |

FOREIGN PATENT DOCUMENTS

| | | |
|---|---|---|
| CN | 102820860 A | 12/2012 |
| CN | 102971640 A | 3/2013 |
| JP | 3022957 | 1/2000 |
| JP | 2008/157687 A | 7/2008 |
| JP | 2014/167422 A | 9/2014 |

* cited by examiner

HALL ELEMENT DRIVING CIRCUIT, SENSOR CIRCUIT, AND CURRENT MEASURING APPARATUS

1. FIELD OF THE INVENTION

The present invention relates to a Hall element driving circuit for driving a Hall element, a sensor circuit including such Hall element driving circuit, and a current measuring apparatus including a Hall element.

2. DESCRIPTION OF THE RELATED ART

The sensor circuit (Hall sensor) disclosed in Japanese Patent 3,022,957 is known as one example of both this type of sensor circuit and a Hall sensor normally used in this type of current serial apparatus. This sensor circuit is configured to switch the flow direction of the excitation current (driving current) supplied to the Hall element (i.e., the direction of the excitation current flowing in the Hall element) and the detection direction of the Hall voltage so as to cancel out an offset produced in the Hall element and peripheral circuits (the offset being a voltage with a characteristic such that its polarity does not change before and after switching the flow direction of the excitation current and the detection direction of the Hall voltage). The sensor circuit includes a switch for switching the flow direction of the excitation current and the detection direction of the Hall voltage. This means that in the sensor circuit, undesirable surge-type noise is produced whenever the switch switches. To remove the effects of such switching noise, in the disclosed sensor circuit, a sampling operation of a sample and hold circuit is carried out according to a clock generated midway during a switching cycle (that is, sampling is carried out with timing that is separated in time from switching operations of the switch).

However, there are cases where the switching noise described above can cause excessive variation in the output signal of the amplifier ("Hall amplifier") used to detect the Hall voltage over a comparatively long period. If such excessive variation continues for a period equal to or longer than the time taken from a switching operation of the switch to the time at which a sampling operation starts, there will be cases where the effects of switching noise remain in the sampling operation of the sample and hold circuit. For this reason, in the sensor circuit, a configuration is used that reduces the effect of the sampling noise on the sample and hold circuit by effectively reducing the amplifier gain of the amplifier mentioned above during switching operations of the switch.

SUMMARY OF THE INVENTION

However, as a result of investigating the sensor circuit described above, the present inventors discovered the following problem to be solved for the sensor circuit described above. That is, the sensor circuit is equipped with four single pole-double throw switches as the switches for switching the flow direction of the excitation current and the detection direction of the Hall element, with one out of the two single pole-double throw switches for switching the flow direction of the excitation current being disposed between the power supply voltage and two contacts of the Hall element and the other single pole-double throw switch being disposed between ground and the other two contacts of the Hall element.

More specifically, in a state where the power supply voltage is continuously applied to a shared contact (c contact) of one of the single pole-double throw switches described above, one contact out of each of the two contact pairs that diagonally face each other in the Hall element is connected to the a and b contacts of the single pole-double throw switch. Also, in a state where ground potential is continuously applied to a shared contact (c contact) of the other of the single pole-double throw switches described above, the other contact out of each of the two contact pairs described above is connected to the a and b contacts of such single pole-double throw switch.

Accordingly, since the sensor circuit described above is configured so as to switch the excitation current from one contact pair to the other contact pair in a state where an excitation current (driving current) flows to one contact pair of the Hall element, the switching noise produced when switching the flow direction of the excitation current in the sensor circuit becomes large, so that for a variety of configurations that use the conventional sensor circuit described above, there is a problem to be solved that it is not possible to completely reduce the effects of switching noise.

Also, as a result of investigating a current measuring apparatus that uses the Hall sensor described above, the present inventors discovered the following problem to be solved for such current measuring apparatus. That is, in a current measuring apparatus, the Hall sensor is equipped with a switch for switching the flow direction of the excitation current and the detection direction of the Hall voltage and is configured to cancel out the offset produced by the Hall element using the characteristics described above. However, as one example, when a magnetic field of a constant strength that is not a magnetic field from the detected object is continuously applied to the Hall element (as examples, magnetic fields from objects aside from the detected object and, for a current measuring apparatus equipped with a core material for guiding a magnetic field from the detected object to the Hall element, a magnetic field applied to the Hall element due to the core material itself becoming magnetized, hereinafter collectively referred to as "superfluous magnetic fields"), in addition to the Hall voltage (the intended Hall voltage) caused by the magnetic field from the detected object, another Hall voltage (a Hall voltage with a constant voltage value) caused by the superfluous magnetic fields is included in the output (Hall voltage) of the Hall element.

Since the other Hall voltage is an error for the intended Hall voltage described above, it is desirable to cancel out the voltage. However, unlike the offset described above, the other Hall voltage has the same polarity as the intended Hall voltage before and after switching the flow direction of the excitation current and the detection direction of the Hall voltage. For this reason, in a current measuring apparatus that uses the Hall sensor described above, there is a problem to be solved that it is not possible to cancel out the other Hall voltage, that is, it is not possible to cancel out the effects on the Hall element of superfluous magnetic fields aside from the magnetic field from the detected object.

The present invention was conceived to solve the problem described above and it is a principal object to provide a Hall element driving circuit and a sensor circuit capable of reducing the switching noise produced during switching of the flow direction of the driving current (excitation current) to the Hall element. It is another principal object of the present invention to provide a current measuring apparatus capable of cancelling out the effects on the Hall element of magnetic fields aside from the magnetic field from the detected object.

To achieve the stated object, a Hall element driving circuit according to the present invention comprises a signal switching unit that is disposed between a power supply unit, which outputs a driving current supplied to a Hall element which includes a first terminal pair and a second terminal pair, and the Hall element and is carried out switching control over one switching state between a first switching state that supplies the driving current to the first terminal pair and a second switching state that supplies the driving current to the second terminal pair; a switching control unit that controls transitions from the first switching state to the second switching state of the signal switching unit and transitions from the second switching state to the first switching state; and a switching unit that is disposed between the power supply unit and the signal switching unit and controls switching to one state out of an on state where outputting of the driving current from the power supply unit to the signal switching unit is permitted and an off state where outputting of the driving current from the power supply unit to the signal switching unit is prevented, wherein the switching control unit controls transitions of the switching unit from the on state to the off state and transitions of the switching unit from the off state to the on state, and executes switching control over the signal switching unit only during a period where the switching unit has made a transition to the off state.

Also, a sensor circuit according to the present invention comprises the Hall element driving circuit; and a signal processing unit that carries out signal processing on a first detection voltage produced between the second terminal pair during the first switching state and a second detection voltage produced between the first terminal pair during the second switching state to detect a Hall voltage of the Hall element in which an offset voltage of the Hall element has been cancelled out.

According to the Hall element driving circuit and the sensor circuit according to the present invention, since the switching unit is included, it is possible to cause the signal switching unit to carry out transitions between the two switching states in a state where the driving current is not being supplied (i.e., to switch the flow direction of the driving current flowing in the Hall element). This means that it is possible to greatly reduce the switching noise produced during switching compared to a configuration where switching is performed in a state where the driving current is being supplied.

Also, the current measuring apparatus according to the present invention comprises a Hall element including a first terminal pair and a second terminal pair; a power supply unit outputting a driving current supplied to the Hall element; a signal switching unit that is disposed between the power supply unit and the Hall element and is carried out control that alternately switches at constant time intervals to a first switching state that supplies the driving current to the first terminal pair and a second switching state that supplies the driving current to the second terminal pair; and a signal processing unit that carries out signal processing on a first detection voltage produced between the second terminal pair during the first switching state and a second detection voltage produced between the first terminal pair during the second switching state to detect a Hall voltage of the Hall element from which an offset voltage of the Hall element has been cancelled out and calculates, based on the Hall voltage, a current flowing in a detected object that is applying a magnetic field to the Hall element, wherein the signal processing unit includes: a correction voltage output circuit that outputs a correction voltage whose voltage value is adjustable; and a Hall voltage generating circuit that corrects the Hall voltage and includes an adder circuit that adds the correction voltage to a voltage produced by the signal processing on the first detection voltage and the second detection voltage, and is configured so as to be capable of adjusting the voltage value of the correction voltage so that the Hall voltage corrected by the Hall voltage generating circuit is zero when the magnetic field from the detected object is not applied to the Hall element.

With the current measuring apparatus according to the present invention, it is possible to cancel out (or greatly reduce) the Hall voltage produced due to only the superfluous magnetic fields using the correction voltage while cancelling out the offset voltage with a conventional method (i.e., a method that cancels out the offset voltage by signal processing of the first detection voltage and the second detection voltage detected by switching the terminal pairs of the Hall element that are supplied with the driving current). This means that with the current measuring apparatus, it is possible to calculate the current value of the current flowing in the detected object with high precision while avoiding saturation due to the Hall voltage (the Hall voltage produced due to only the superfluous magnetic fields) in the Hall voltage generating circuit that execute signal processing on the Hall voltage (the first detection voltage and the second detection voltage) outputted from the Hall element.

Also, the current measuring apparatus according to the present invention, wherein the signal processing unit includes a differential amplifier with a pair of input terminals that are connected to the second terminal pair during the first switching state and are connected to the first terminal pair during the second switching state and outputs, from an output terminal, a third detection voltage that alternates at constant time intervals between the first detection voltage as a positive voltage and the second detection voltage as a negative voltage, the correction voltage output circuit alternately outputs, as the correction voltage, a positive correction voltage and a negative correction voltage whose respective absolute values are equal in synchronization with the third detection voltage, and the Hall voltage generating circuit outputs, by having the adder circuit add the third detection voltage and the correction voltage, a corrected Hall voltage in which the first detection voltage has been corrected by adding the negative correction voltage and the second detection voltage has been corrected by adding the positive correction voltage.

With the configuration described above, by adjusting the voltage value of the correction voltage and the voltage value of the Hall voltage (a Hall voltage produced due to only the superfluous magnetic fields) so as to be equal, it is possible to accurately correct the third detection voltage whose voltage value changes at certain time intervals using the voltage value of the correction voltage (a voltage value that alternates in synchronization with the third detection voltage between the positive correction voltage and the negative correction voltage whose absolute values are equal). This means that for a third detection voltage of this type, in a Hall voltage generating circuit configured of analog circuits including an adder circuit, it is possible to substantially cancel out a Hall voltage (the Hall voltage produced due to only the superfluous magnetic fields) while avoiding saturation due to such Hall voltage.

Also, the current measuring apparatus according to the present invention, wherein the signal processing unit includes: an A/D conversion circuit that carries out A/D conversion of the corrected Hall voltage; and a computing circuit that acquires data outputted from the A/D conversion circuit, wherein the computing circuit is operable when the magnetic field from the detected object is not being applied to the Hall element, to store the data as correction voltage data, and is operable when the magnetic field from the detected object is being applied to the Hall element, to calculate the current based on data obtained by correcting the data using the correction voltage data.

With this configuration, since it is possible, even when the voltage value of the correction voltage and the voltage value of a Hall voltage (i.e., the Hall voltage produced due to only the superfluous magnetic fields) are slightly different, to completely cancel out the effects of such Hall voltage, it is possible to calculate the current value of the current flowing in the detected object with high precision.

Also, the current measuring apparatus according to the present invention, wherein the correction voltage output circuit includes: a variable power supply constructed so that a voltage value of an output voltage is adjustable; a switch that outputs by switching between the output voltage and zero volts alternately at constant time intervals; and a capacitor that removes a direct current component included in an output from the switch and outputs as the correction voltage.

With this configuration, it is possible to easily and reliably generate and output, using simple circuits, the correction voltage that changes from the negative correction voltage to the positive correction voltage and changes from the positive correction voltage to the negative correction voltage at constant time intervals. Also, by adjusting the voltage value of the variable power supply, it is possible to simultaneously change the voltage values of the positive correction voltage and the negative correction voltage that have different polarities in a state where the absolute values of the voltages match.

It should be noted that the disclosure of the present invention relates to the contents of Japanese Patent Application 2015-14571 that was filed on Jan. 28, 2015 and Japanese Patent Application 2015-55636 that was filed on Mar. 19, 2015, the entire contents of which are herein incorporated by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Figure 1:
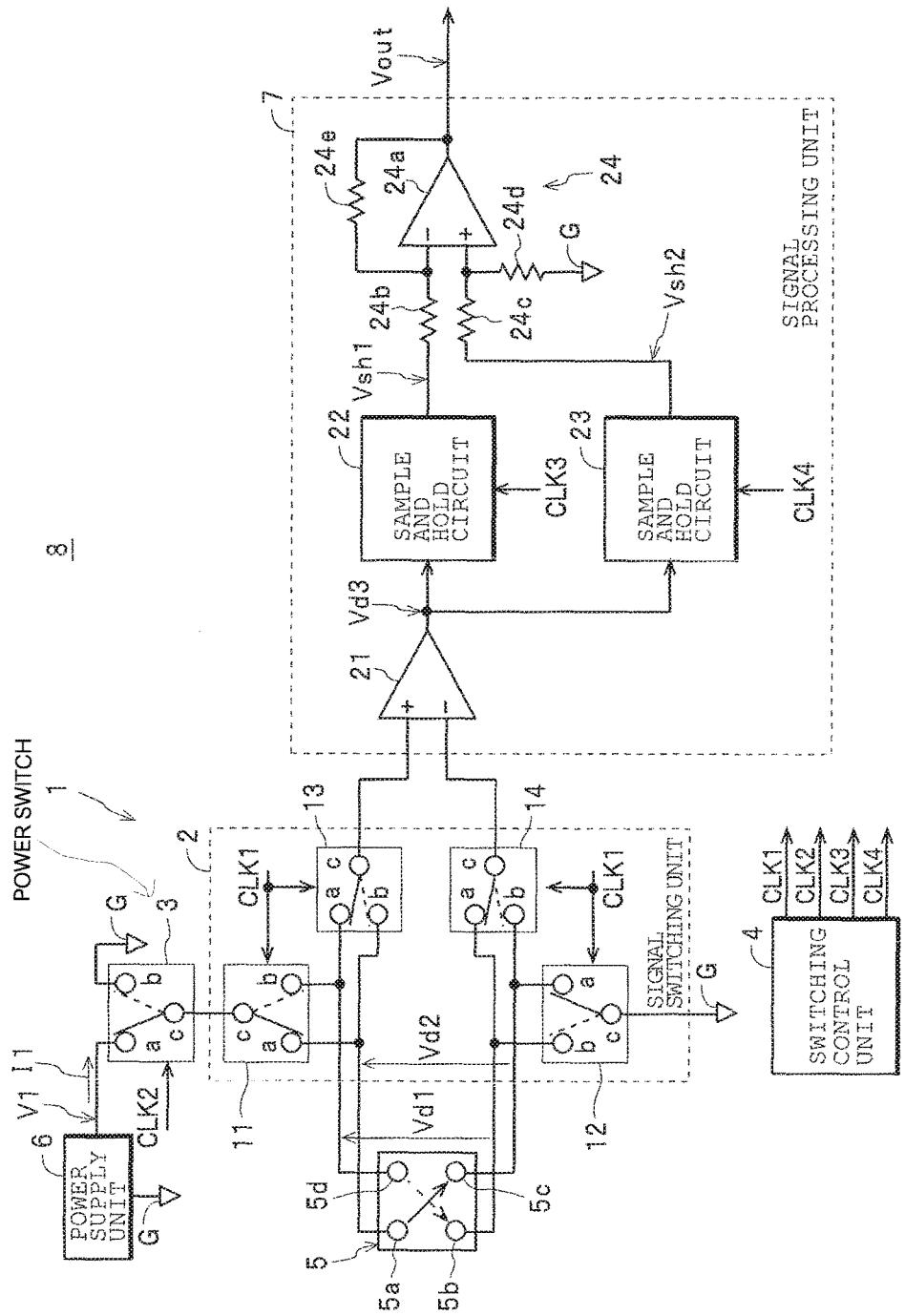
FIG. 1 is a block diagram of a Hall element driving circuit and a sensor circuit.

Embodiments of a Hall element driving circuit, a sensor circuit, and a current measuring apparatus are described below with reference to the attached drawings.

First, the configurations of the Hall element driving circuit and the sensor circuit will be described with reference to the drawings.

First, the configuration of a Hall element driving circuit 1 as the Hall element driving circuit shown in FIG. 1 will be described. The Hall element driving circuit 1 includes a signal switching unit 2, a power switch 3 (hereafter referred to as the switching unit 3), and a switching control unit 4, and is configured so as to be capable of switching a driving current I1 from a power supply unit 6 to an arbitrary one of a first terminal pair 5a and 5c and a second terminal pair 5b and 5d of a Hall element 5 (i.e., switching the flow direction of the driving current I1 to the Hall element 5).

The Hall element 5 driven by the Hall element driving circuit 1 is formed in a shape, such as a square or a cross, that has up-down and left-right symmetry when viewed from above and has the terminal pairs 5a, 5b, 5c, and 5d mentioned above disposed in the four corners in order in the counterclockwise direction or clockwise direction (as one example in the present embodiment, the counterclockwise direction). In a state where the driving current I1 is being supplied to an arbitrary pair of terminals out of the first terminal pair 5a and 5c and the second terminal pair 5b and 5d, a voltage (hereinafter also referred to as the "Hall voltage Vh") that is proportional to the magnetic flux density of the magnetic flux passing through the Hall element 5 is produced between the other terminal pair to which the driving current I1 is not being supplied.

However, the Hall element 5 has a characteristic whereby due to variations during manufacturing, even when the magnetic flux density is zero, an offset voltage Vos whose voltage is substantially constant is produced between the other terminal pair. Due to this characteristic, the Hall element 5 will output a detection voltage Vd that includes the offset voltage Vos in addition to the Hall voltage Vh from the terminal pair to which the driving current I1 is not being supplied. In the following description, out of the detection voltage Vd, the voltage outputted from the first terminal pair 5a and 5c is indicated as the second detection voltage Vd2(−Vh+Vos) and the voltage outputted from the second terminal pair 5b and 5d is indicated as the first detection voltage Vd1(Vh+Vos).

In this case, the power supply unit 6 is constructed of a constant-voltage DC power supply or a constant-current DC power supply and outputs a constant voltage or a constant current to the Hall element 5. As one example in the present embodiment, the power supply unit 6 is constructed of a constant-voltage DC power supply and supplies the driving current I1 to the Hall element 5 by outputting a constant voltage V1 to the Hall element 5, but it is also possible to construct the power supply unit 6 of a constant-current DC power supply and to supply the driving current I1 to the Hall element 5 as a constant current.

The Hall element driving circuit 1 is configured so as to be capable of switching the output between the first detection voltage Vd1 produced between the second terminal pair 5b and 5d in a state where the driving current I1 is being supplied to the first terminal pair 5a and 5c and the second detection voltage Vd2 produced between the first terminal pair 5a and 5c in a state where the driving current I1 is being supplied to the second terminal pair 5b and 5d. The Hall element driving circuit 1 includes the Hall element 5, and a signal processing unit 7 and sensor circuit 8, described later.

As a specific example, the signal switching unit 2 includes four switches (as one example, single pole-double throw switches) 11, 12, 13, and 14, with the switch 11 being disposed between the power supply unit 6 and the Hall element 5 by connecting the c contact of the switch 11 via the switching unit 3 to the power supply unit 6, connecting the a contact to one of the terminals 5a out of the first terminal pair 5a and 5c, and connecting the b contact to one of the terminals 5d out of the second terminal pair 5b and 5d. The switch 12 is disposed between the reference potential (ground G) and the Hall element 5 by connecting the c contact of the switch 12 to a reference potential (the ground G) of the Hall element driving circuit 1, connecting the a contact to the other terminal 5c out of the first terminal pair 5a and 5c, and connecting the b contact to the other terminal 5b out of the second terminal pair 5b and 5d.

The switch 13 is disposed between the signal processing unit 7 and the Hall element 5 by connecting the c contact of the switch 13 to the signal processing unit 7 described later (more specifically, a non-inverting input terminal of a differential amplifier 21 that constructs part of the signal processing unit 7), connecting the a contact to one of the terminals 5d out of the second terminal pair 5b and 5d, and connecting the b contact to one of the terminals 5a out of the first terminal pair 5a and 5c. The switch 14 is also disposed between the signal processing unit 7 and the Hall element 5 by connecting the c contact of the switch 14 to the signal processing unit 7 (more specifically, an inverting input terminal of the differential amplifier 21 that constructs part of the signal processing unit 7), connecting the a contact to the other terminal 5b out of the second terminal pair 5b and 5d, and connecting the b contact to the other terminal 5c out of the first terminal pair 5a and 5c. The switches 11 to 14 are controlled so that during a Hi level period of a control signal CLK1 outputted from the switching control unit 4, the a contacts of the switches 11 to 14 are connected to the c contacts, and during a Low level period of the control signal CLK1, the b contacts are connected to the c contacts.

As one example, the switching unit 3 is constructed of a single switch (for example, a single pole-double throw switch), and is disposed between the power supply unit 6 and the signal switching unit 2 by connecting an c contact of the switching unit 3 to the c contact of the switch 11, connecting an a contact to an output terminal of the power supply unit 6, and connecting a b contact to the reference potential (ground G). Switching control is carried out so that during a Hi level period of the control signal CLK2 outputted from the switching control unit 4, the a contact of the switching unit 3 is connected to the c contact (a transition to an "on" state where outputting of the driving current I1 from the power supply unit 6 to the signal switching unit 2 is permitted) and on the other hand, during a Low level period of the control signal CLK2, the b contact is connected to the c contact (a transition to an "off" state where outputting of the driving current I1 from the power supply unit 6 to the signal switching unit 2 is prevented (stopped)). Note that as the switching unit 3, in place of a single pole-double throw switch, it is also possible to use a single pole-single throw switch. In this case, the switching unit 3 connects the c contact of the switch 11 to the output terminal of the power supply unit 6 during the on state and places the c contact of the switch 11 in an open state during the off state.

The switching control unit 4 generates four control (switching) signals CLK1, CLK2, CLK3, and CLK4 with the timing shown in FIG. 2, outputs the control signal CLK1 to the switches 11, 12, 13, and 14, outputs the control signal CLK2 to the switching unit 3, outputs the control signal CLK2 to the switching unit 3, outputs the control signal CLK3 to the signal processing unit 7 (more specifically, a sample and hold circuit 22, described later, that constructs part of the signal processing unit 7), and outputs the control signal CLK4 to the signal processing unit 7 (more specifically, a sample and hold circuit 23, described later, that constructs part of the signal processing unit 7).

As one example in the present embodiment, the switching control unit 4 outputs the control signal CLK1 as a pulse signal with a duty ratio of 0.5 with a constant frequency (for example, several tens of kHz (as one example, 40 kHz)). The switching control unit 4 outputs the control signal CLK2 as a pulse signal that has a frequency which is double the frequency of the control signal CLK1, that is a Low level for only a predetermined period T1 and a predetermined period T2 that are respectively immediately before and immediately after timing at which there is a switch from a Low level period to a Hi level period of the control signal CLK1 and a predetermined period T3 and a predetermined period T4 that are respectively immediately before and immediately after timing at which there is a switch from a Hi level period to a Low level period of the control signal CLK1, and that has a Hi level for the rest of the time.

Also, the switching control unit 4 outputs the control signal CLK3 as a pulse signal with the same frequency as the frequency of the control signal CLK1 and as one example has a Hi level for only a predetermined period with timing that is substantially midway in a Hi level period of the control signal CLK1 (i.e., a shorter period than a Hi level period of the control signal CLK1), and has a Low level for the rest of the time. The switching control unit 4 outputs the control signal CLK4 as a pulse signal with the same frequency as the frequency of the control signal CLK1 and as one example has a Hi level for only a predetermined period with timing that is substantially midway in a Low level period of the control signal CLK1 (i.e., a shorter period than a Hi level period of the control signal CLK1), and has a Low level for the rest of the time.

Next, the configuration of the sensor circuit 8 as the sensor circuit shown in FIG. 1 will be described. The sensor circuit 8 is equipped with the Hall element driving circuit 1 described above, the Hall element 5 described above, the power supply unit 6, and the signal processing unit 7, and outputs an output voltage Vout (a voltage that does not include the offset voltage Vos described above and is composed of only the Hall voltage Vh described above) that is proportional to the magnetic flux density of the magnetic flux that passes the Hall element 5. Note that it is also possible to provide the power supply unit 6 outside the sensor circuit 8.

As one example, the signal processing unit 7 is equipped with the differential amplifier 21, the sample and hold circuits 22 and 23, and a subtractor circuit 24, and detects the Hall voltage Vh by executing signal processing that cancels out the offset voltage Vos of the Hall element 5 based on the first detection voltage Vd1 and the second detection voltage Vd2. Here, the non-inverting input terminal of the differential amplifier 21 is connected to the c contact of the switch 13 and the inverting input terminal is connected to the c contact of the switch 14. As one example, by setting the gain at one, as described later the differential amplifier 21 outputs one voltage out of the first detection voltage Vd1 and the second detection voltage Vd2 outputted via the switches 13 and 14 (i.e., the voltage selected by the switches 13 and 14) as a third detection voltage Vd3.

The sample and hold circuit 22 detects and holds the voltage of the third detection voltage Vd3 during the Hi level period of the control signal CLK3 and outputs the voltage as the sampling voltage Vsh1. On the other hand, the sample and hold circuit 23 detects and holds the voltage of the third detection voltage Vd3 during the Hi level period of the control signal CLK4 and outputs the voltage as the sampling voltage Vsh2.

The subtractor circuit 24 outputs the output voltage Vout by detecting the difference between the two sampling voltages Vsh1 and Vsh2. In the present embodiment, as one example, the subtractor circuit 24 includes a differential amplifier 24a, input resistors 24b and 24c respectively connected to the non-inverting input terminal and the inverting input terminal of the differential amplifier 24a, a grounding resistor 24d connected between the non-inverting input terminal and the ground G, and a feedback resistor 24e connected between the inverting input terminal and the output terminal. The input resistors 24b and 24c are set so as to have equal resistance values. The grounding resistor 24d and the feedback resistor 24e are also set so as to have equal resistance values and as one example in the present embodiment, are set at ½ of the resistance value of the input resistors 24b and 24c. By using this configuration, the subtractor circuit 24 detects the difference between the sampling voltages Vsh1 and Vsh2, amplifies the difference by a gain with a value produced by dividing the resistance value of the feedback resistor 24e by the resistance value of the input resistor 24b (as one example in the present embodiment, 0.5), and outputs the result as the output voltage Vout.

Next, the operation of the Hall element driving circuit 1 and the sensor circuit 8 will be described with reference to the drawings.

Figure 2:
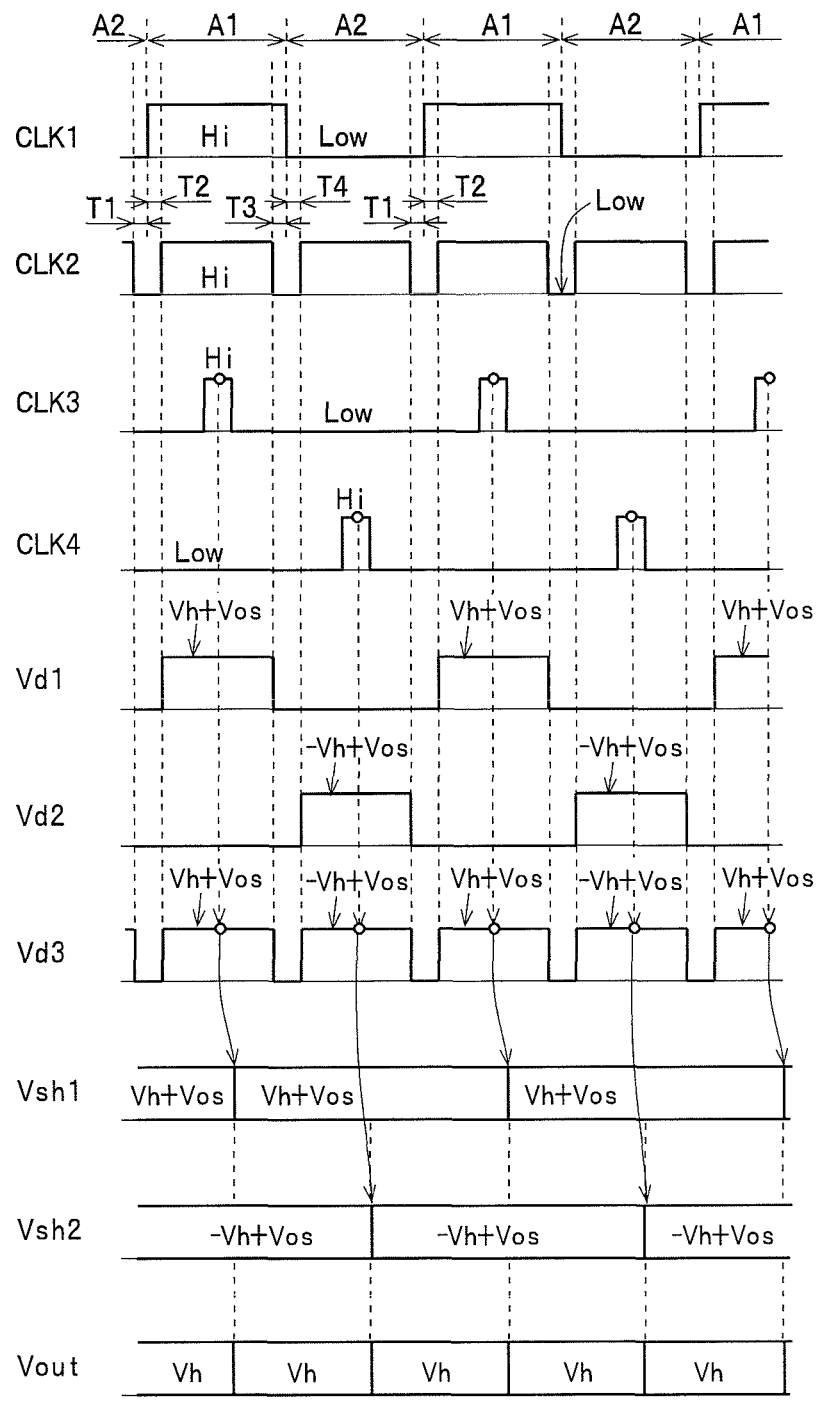
FIG. 2 is a waveform diagram useful in explaining the operation of the Hall element driving circuit and the sensor circuit.

In a state where the switching control circuit 4 outputs the control signals CLK1 to CLK4 as shown in FIG. 2 with the timing described above, when the control signal CLK1 switches from the Low level to the Hi level, a period A2 (a period where there is a transition to a second switching state where the driving current I1 is supplied to the second terminal pair 5b and 5d) ends, and a period A1 (a period where there is a transition to a first switching state where the driving current I1 is supplied to the first terminal pair 5a and 5c) starts, for the predetermined periods T1 and T2 before and after the timing at which the control signal CLK1 switches from the Low level to the Hi level, the control signal CLK2 is kept at the Low level. Since the switching unit 3 is controlled according to the control signal CLK2 so that the c contact is connected to the b contact, the supplying of the constant voltage V1 outputted from the power supply unit 6 to the switch 11 is stopped (in the present embodiment, the c contact of the switch 11 is connected via the switching unit 3 to the ground G).

By doing so, the switches 11 and 12 are switched according to the control signal CLK1 from a state where the respective c contacts are connected to the b contacts to a state where the c contacts are connected to the a contacts in a state where the driving current I1 is not being supplied. Accordingly, compared to a configuration where the connected state of the contacts of the switches 11 and 12 are switched in a state where the driving current I1 is being supplied, there is a large reduction in the switching noise produced when switching the connected state of the contacts. The switches 13 and 14 are also switched according to the control signal CLK1 from a state where the respective c contacts are connected to the b contacts to a state where the c contacts are connected to the a contacts.

As shown in FIG. 2, when the predetermined period T2 that starts immediately after the start of the period A1 has ended, the control signal CLK2 switches from the Low level to the Hi level. This means that the switching unit 3 is switched according to the control signal CLK2 to a state where the c contact is connected to the a contact (a state where the constant voltage V1 from the power supply unit 6 is supplied via the switching unit 3 to the c contact of the switch 11). By doing so, during a Hi level period of the control signal CLK2, a current path is formed from the power supply unit 6 to ground G via the switching unit 3, the switch 11, the first terminal pair 5a and 5c of the Hall element 5, and the switch 12, and the driving current I1 flows on this current path (that is, the driving current I1 flows to the first terminal pair 5a and 5c of the Hall element 5). For this reason, as shown in FIG. 2, during the Hi level period of the control signal CLK2, the first detection voltage Vd1 (=Vh+Vos) is produced between the second terminal pair 5b and 5d of the Hall element 5 and the first detection voltage Vd1 is outputted to the signal processing unit 7 via the switches 13 and 14.

As shown in FIG. 2, in the signal processing unit 7, the differential amplifier 21 first inputs and amplifies the first detection voltage Vd1 and outputs as the third detection voltage Vd3 to the sample and hold circuits 22 and 23. In the period A1, the control signal CLK3 becomes the Hi level at timing which is substantially midway during the Hi level period of the control signal CLK2. For this reason, as shown in FIG. 2, the sample and hold circuit 22 detects and holds the voltage (Vh+Vos) of the inputted third detection voltage Vd3 at timing when the control signal CLK3 becomes the Hi level and outputs as the sampling voltage Vsh1.

As shown in FIG. 2, the control signal CLK2 then switches from the Hi level to the Low level when the predetermined period T3 (a period that starts before the period A1 ends and ends when the period A1 has ended) starts. This means that the switching unit 3 is switched according to the control signal CLK2 to a state where the c contact is connected to the b contact (the state where the c contact of the switch 11 is connected via the switching unit 3 to the ground G). By doing so, the supplying of the driving current I1 to the first terminal pair 5a and 5c of the Hall element 5 is stopped.

After this, as shown in FIG. 2, the control signal CLK switches from the Hi level to the Low level, a period A1 ends, and a period A2 starts. In a predetermined period T4 after the timing at which the control signal CLK1 switches from the Hi level to the Low level, the control signal CLK2 is kept at the Low level continuing on from the predetermined period T3. By doing so, the switches 11 and 12 are switched, in a state where the driving current I1 is not being supplied, according to the control signal CLK1 from a state where the respective c contacts are connected to the a contacts to a state where the c contacts are connected to the b contacts. Accordingly, compared to a configuration where the connected state of the contacts of the switches 11 and 12 is switched in a state where the driving current I1 is being supplied, the switching noise produced when switching the connected state of the contacts is greatly reduced. The switches 13 and 14 are also switched according to the control signal CLK1 from a state where the respective c contacts are connected to the a contacts to a state where the c contacts are connected to the b contacts.

As shown in FIG. 2, when a predetermined period T4 that starts immediately after the start of the period A2 has ended, the control signal CLK2 is switched from the Low level to the Hi level. This means that the switching unit 3 is switched according to the control signal CLK2 to a state where the c contact is connected to the a contact (a state where the constant voltage V1 from the power supply unit 6 is supplied via the switching unit 3 to the c contact of the switch 11). By doing so, during the period where the control signal CLK2 is at the Hi level, a current path that reaches the ground G from the power supply unit 6 via the switching unit 3, the switch 11, the second terminal pair 5b and 5d of the Hall element 5, and the switch 12 is formed and the driving current I1 flows on such current path (that is, the driving current I1 flows to the second terminal pair 5b and 5d of the Hall element 5). This means that as shown in FIG. 2, during the Hi level period of the control signal CLK2, a second detection voltage Vd2 (=−Vh+Vos) is generated between the first terminal pair 5a and 5c of the Hall element 5 and the second detection voltage Vd2 is outputted via the switches 13 and 14 to the signal processing unit 7.

As shown in FIG. 2, in the signal processing unit 7, the differential amplifier 21 inputs and amplifies the second detection voltage Vd2 and outputs to the sample and hold circuits 22 and 23 as the third detection voltage Vd3. During the period A2, the control signal CLK4 becomes the Hi level at timing that is substantially midway during the Hi level period of the control signal CLK2. This means that as shown in FIG. 2, the sample and hold circuit 23 detects and holds the voltage (−Vh+Vos) of the third detection voltage Vd3 being inputted at the timing where the control signal CLK4 becomes the Hi level, and outputs as the sampling voltage Vsh2.

As shown in FIG. 2, the control signal CLK2 then switches from the Hi level to the Low level when the predetermined period T1 (a period that starts before the end of the period A2 and ends when the period A2 ends) starts. This means that the switching unit 3 is switched according to the control signal CLK2 to a state where the c contact is connected to the b contact (a state where the c contact of the switch 11 is connected via the switching unit 3 to the ground G). By doing so, the supplying of the driving current I1 to the first terminal pair 5a and 5c of the Hall element 5 is stopped.

In the signal processing unit 7, as shown in FIG. 2, the subtractor circuit 24 detects and amplifies (by 0.5) the difference (2×Vh) between the sampling voltages Vsh1 and Vsh2 outputted as described above from the sample and hold circuits 22 and 23 and outputs as the output voltage Vout (=Vh).

After this, by having the Hall element driving circuit 1 and the signal processing unit 7 repeat the operation described above, the sensor circuit 8 updates and outputs the output voltage Vout at intervals of the control signal CLK2.

In this way, the Hall element driving circuit 1 and the sensor circuit 8 include the switching unit 3 that is disposed between the power supply unit 6 and the signal switching unit 2 and controls switching between an on state where outputting of the driving current I1 from the power supply unit 6 to the signal switching unit 2 is permitted and an off state where outputting of the driving current I1 to the signal switching unit 2 is prevented, with the switching control unit 4 executing switching control (i.e., switching control from the first switching state to the second switching state and switching control from the second switching state to the first switching state) over the signal switching unit 2 only during a period where the switching unit 3 has entered the off state (a period composed of the predetermined periods T1 and T2 in combination and a period composed of the predetermined periods T3 and T4 in combination).

Accordingly, according to the Hall element driving circuit 1 and the sensor circuit 8, since it is possible to switch the switches 11 and 12 of the signal switching unit 2 that construct part of the Hall element driving circuit 1 (i.e., to switch the terminal pair supplied with the driving current I1 from one of the first terminal pair 5a and 5c and the second terminal pair 5b and 5d to the other, or in other words, to switch the flow direction of the driving current I1 flowing in the Hall element 5) in a state where the driving current I1 is not being supplied, compared to a configuration that performs such switching in a state where the driving current I1 is being supplied, it is possible to greatly reduce the switching noise produced during switching. Also, since the supplying of the driving current I1 to the Hall element 5 is stopped during a period that is a combination of the predetermined periods T1 and T2 are combined and a period that is a combination of the predetermined periods T3 and T4, it is possible to make a corresponding reduction in the power consumption of the Hall element 5 and in the power consumption of the sensor circuit 8 as a whole.

Note that although the signal processing unit 7 that uses a non-differential output-type differential amplifier 21 is used in the example described above, like a sensor circuit 8A shown in FIG. 3, it is also possible to use a configuration where a signal processing unit 7A that uses a differential output-type differential amplifier 21A is combined with the Hall element driving circuit 1. In a signal processing unit 7A with this configuration, as shown in the drawing, two sample and hold circuits 22a, 22b that execute a sampling operation according to the control signal CLK3 and two sample and hold circuits 23a, 23b that execute a sampling operation according to the control signal CLK4 are connected to the output terminals of the differential amplifier 21A. Note that the configurations that are the same as the sensor circuit 8 have been assigned the same reference numerals and duplicated description thereof is omitted.

Figure 3:
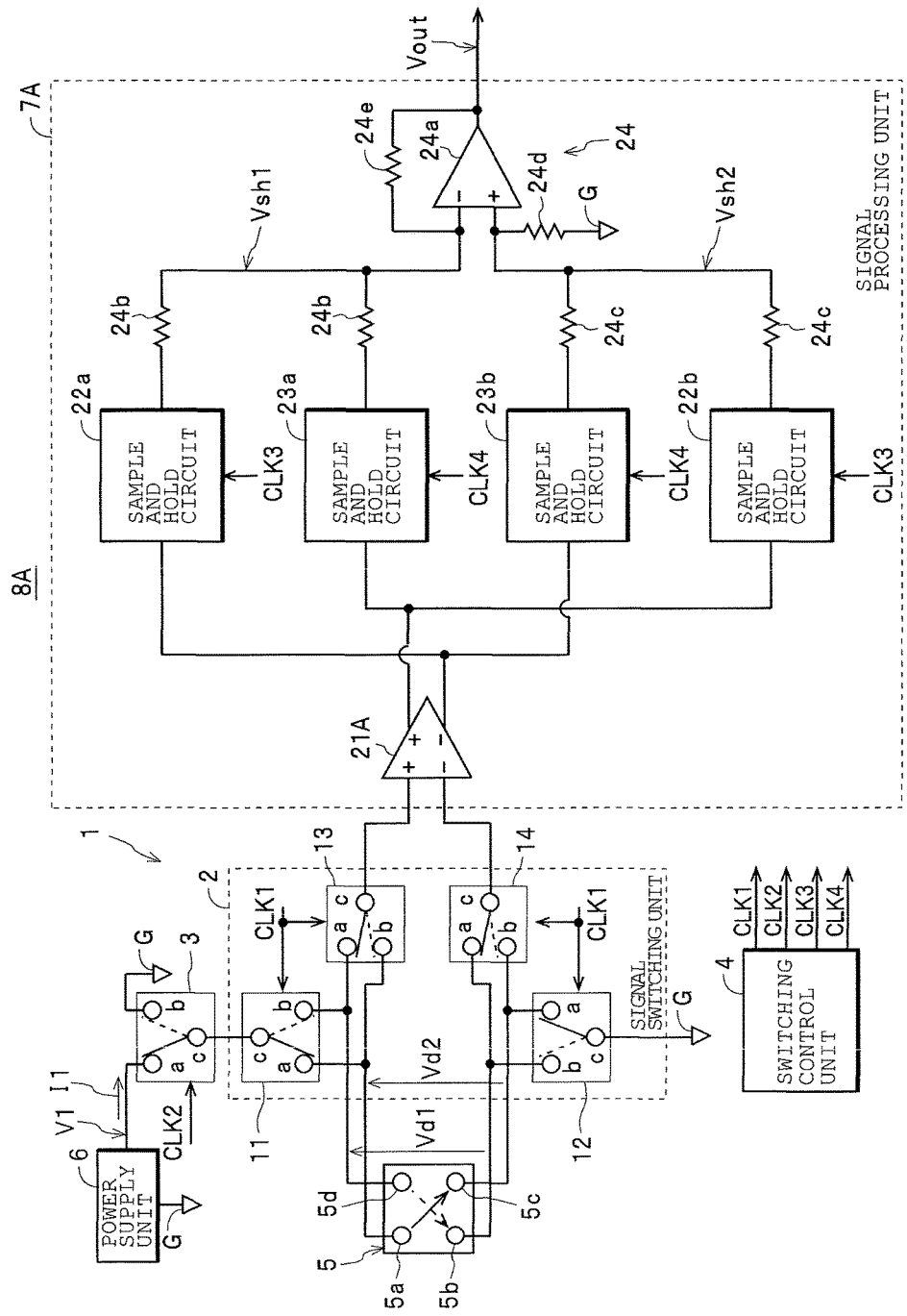
FIG. 3 is a block diagram of the Hall element driving circuit and another sensor circuit.
Figure 4:
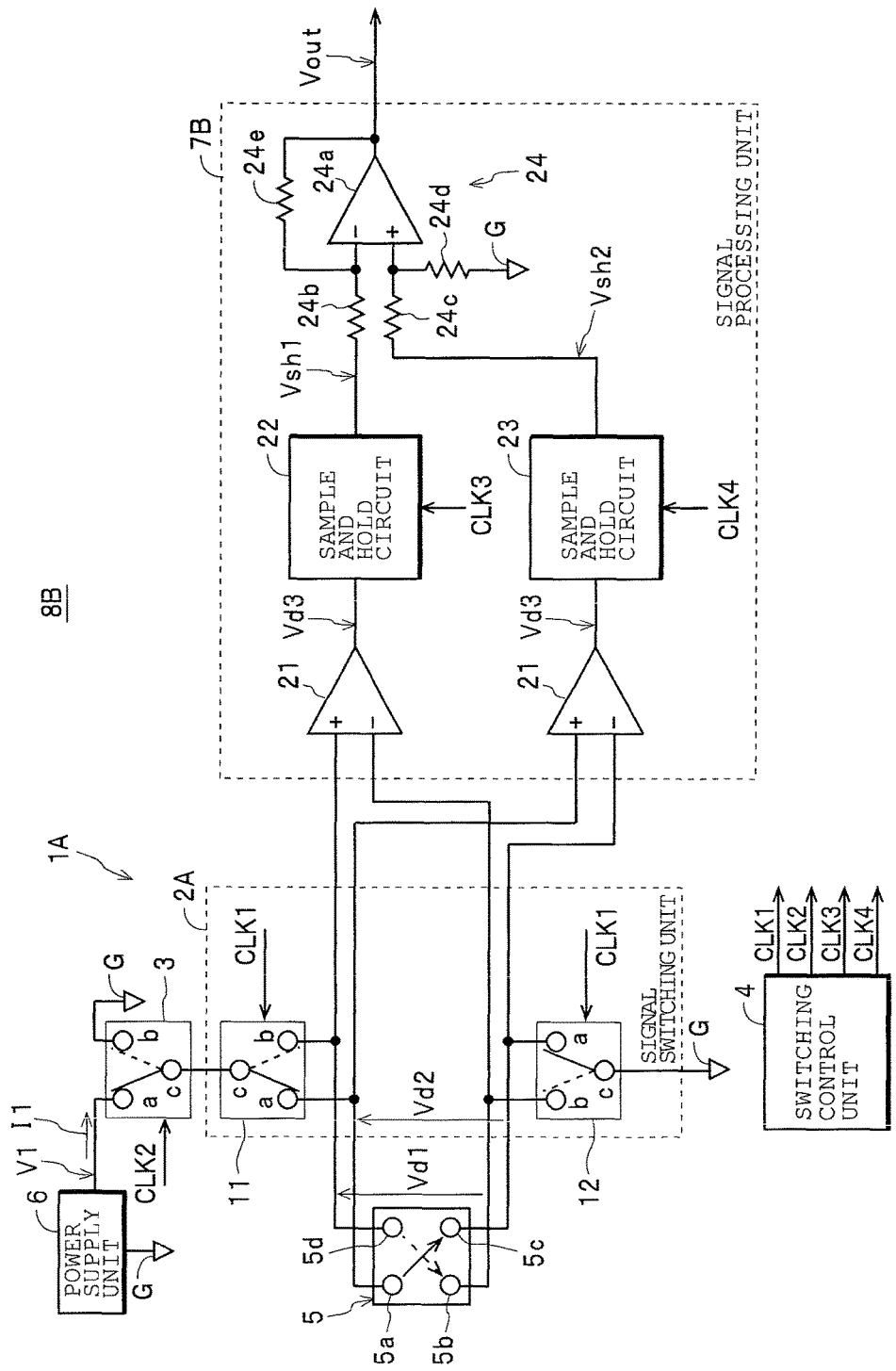
FIG. 4 is a block diagram of the Hall element driving circuit and yet another sensor circuit.

Also, although as shown in FIGS. 1 and 3, a configuration is used in the Hall element driving circuit 1 described above where the first detection voltage Vd1 and the second detection voltage Vd2 outputted from the terminal pairs of the Hall element 5 are switched by the switches 13 and 14 and outputted to one differential amplifier 21 (21A) of the signal processing unit 7 (7A), when the Hall element driving circuit is combined with a signal processing unit (like a signal processing unit 7B of a sensor circuit 8B shown in FIG. 4) in which dedicated differential amplifiers 21, 21 are disposed before each of the two sample and hold circuits 22 and 23, it is also possible to use a signal switching unit 2A with a configuration that omits the switches 13 and 14 as in the Hall element driving circuit 1A shown in FIG. 4. Note that the configurations that are the same as the sensor circuit 8 have been assigned the same reference numerals and duplicated description thereof is omitted.

Also, although not illustrated, even with a configuration that uses a differential output-type differential amplifier 21A like the signal processing unit 7A of the sensor circuit 8A shown in FIG. 3, by using two differential amplifiers 21A, it is possible to construct a sensor circuit for use in combination with the Hall element driving circuit 1A described above.

Figure 5:
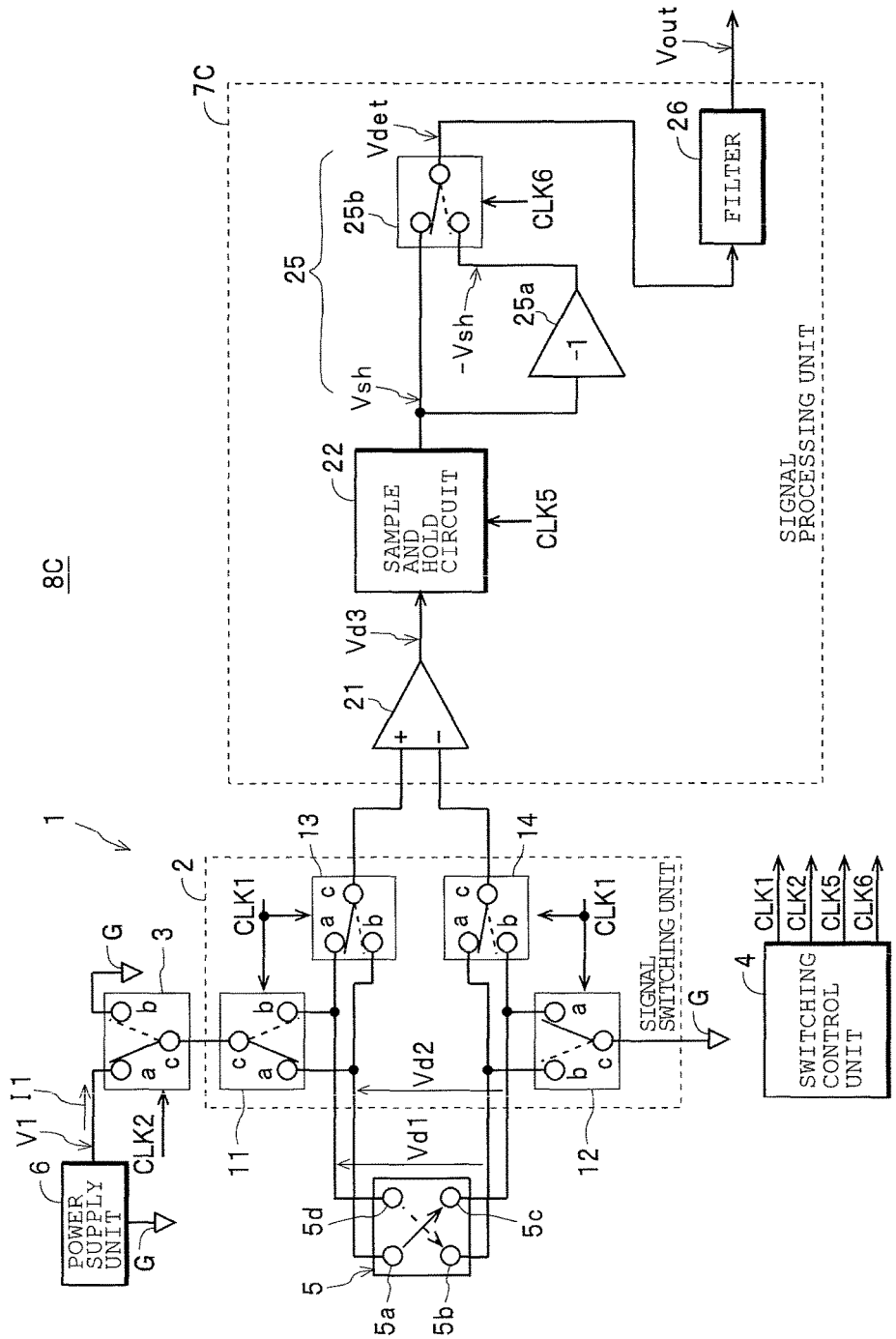
FIG. 5 is a block diagram of the Hall element driving circuit and yet another sensor circuit.

Also, although signal processing that cancels out the offset voltage Vos of the Hall element 5 by subtracting, at the subtractor circuit 24, the two sampling voltages Vsh1 and Vsh2 obtained by sampling the two voltages, i.e., the first detection voltage Vd1 (=Vh+Vos) and the second detection voltage Vd2 (=−Vh+Vos) outputted from the Hall element 5 is executed by the signal processing unit 7, 7A, and 7B of the sensor circuits 8, 8A, and 8B described above, it is also possible to use a configuration that outputs the output voltage (a voltage that does not include the offset voltage Vos described above and is composed of only the Hall voltage Vh described above) Vout by executing signal processing in the form of synchronous detection and filtering of the two voltages, i.e., the first detection voltage Vd1 (=Vh+Vos) and the second detection voltage Vd2 (=−Vh+Vos) in the same way as a signal processing unit 7C of a sensor circuit 8C shown in FIG. 5.

The sensor circuit 8C is described below with reference to FIGS. 5 and 6. Note that the configurations that are the same as the sensor circuit 8 have been assigned the same reference numerals and duplicated description thereof is omitted.

In the sensor circuit 8C, the switching control unit 4 generates four control (switching) signals CLK1, CLK2, CLK5, and CLK6 with the timing shown in FIG. 6 and outputs the control signal CLK1 to the switches 11, 12, 13, and 14, outputs the control signal CLK2 to the switching unit 3, outputs the control signal CLK5 to the sample and hold circuit 22 of the signal processing unit 7C, and outputs the control signal CLK6 to a synchronous detection circuit 25, described later, of the signal processing unit 7C.

As one example, the signal processing unit 7C is equipped with the differential amplifier 21, the sample and hold circuit 22, the synchronous detection circuit 25, and a filter (low pass filter) 26. In this case, as shown in FIG. 6, the sample and hold circuit 22 detects and holds the third detection voltage Vd3 outputted from the differential amplifier 21 based on the control signal CLK5 that becomes the Hi level at both the timing where the control signal CLK3 described above is at the Hi level and the timing where the control signal CLK4 described above is at the Hi level, and outputs as the sampling voltage Vsh shown in FIG. 6.

Figure 6:
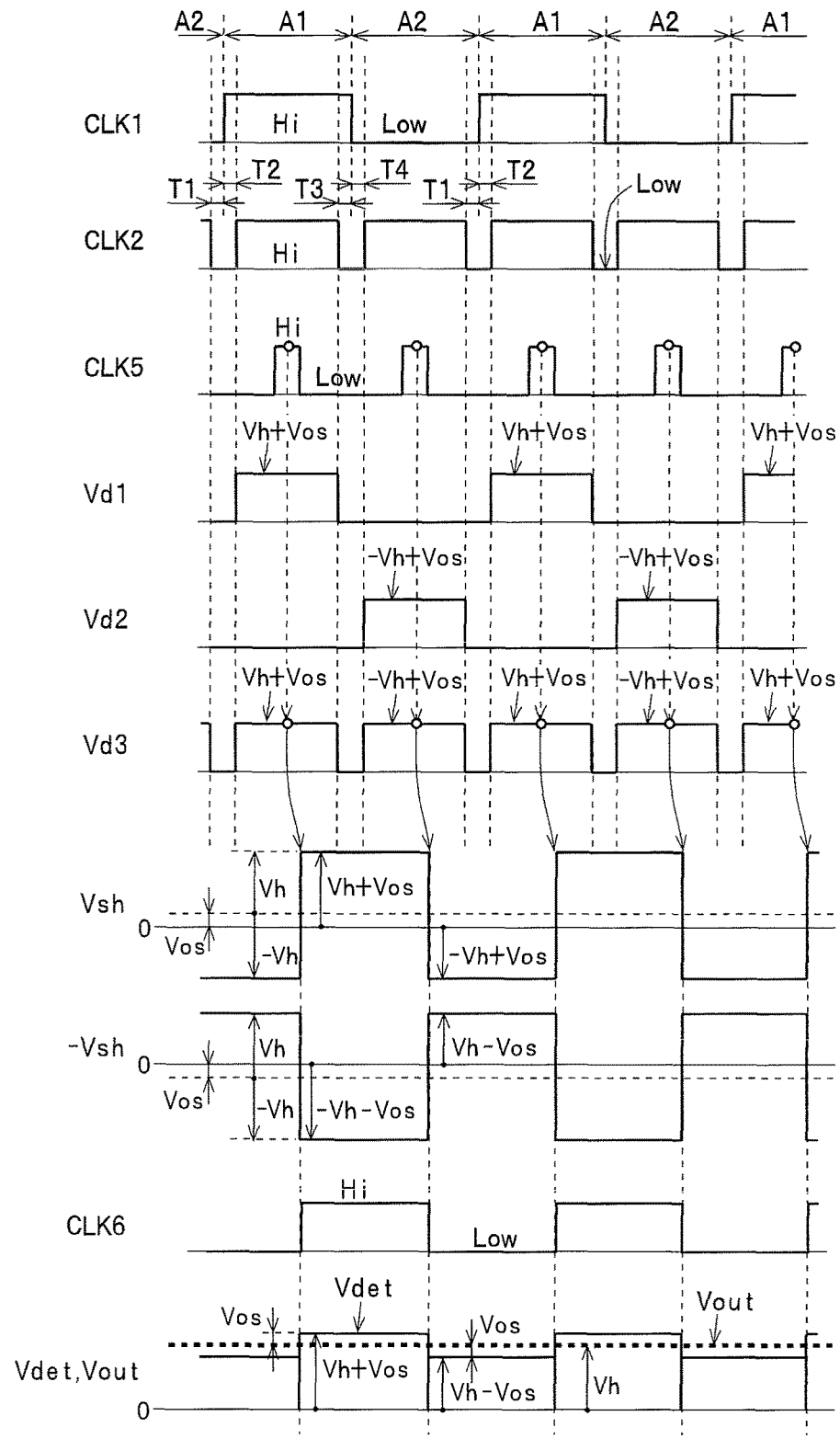
FIG. 6 is a waveform diagram useful in explaining an operation of the Hall element driving circuit and a sensor circuit.

As one example, the synchronous detection circuit 25 includes an amplifier 25a that inputs the sampling voltage Vsh, amplifies the sampling voltage Vsh with a gain of −1, and outputs as the sampling voltage −Vsh (see FIG. 5) and a switch 25b that inputs the two sampling voltages Vsh and −Vsh, alternately switches between the voltage Vsh and −Vsh in synchronization with the control signal CLK6 with the timing shown in FIG. 6 (a clock signal with the same phase as the sampling voltage Vsh and the same frequency as the sampling voltages Vsh, −Vsh) and outputs as a detection signal Vdet (see FIG. 6). In this case, as shown in the drawings, as one example the switch 25b outputs the detection signal Vdet by switching to the sampling voltage Vsh during a Hi level period of the control signal CLK6 and switching to the sampling voltage −Vsh during a Low level period.

The filter 26 outputs the output voltage Vout by inputting and averaging the detection signal Vdet.

Here, as shown in FIG. 6, the sampling voltage Vsh outputted from the sample and hold circuit 22 is a signal where there are transitions in the voltage value from the voltage value (Vh+Vos) to the voltage value (−Vh+Vos) with the opposite polarity to the voltage value (Vh+Vos) and from the voltage value (−Vh+Vos) to the voltage (Vh+Vos) with the cycle of the control signal CLK6 as the sampling clock. The sampling voltage −Vsh is a signal with the opposite polarity to the sampling voltage Vsh. As shown in FIG. 6, as one example the switch 25b switches between a waveform of a period where the sampling voltage Vsh is the voltage (Vh+Vos) and the waveform of a period where the sampling voltage −Vsh is the voltage (Vh−Vos) and outputs as the detection signal Vdet.

As a result, the detection signal Vdet is a signal whose voltage value has transitions from the voltage value (Vh+Vos) to the voltage value (Vh−Vos) and from the voltage value (Vh−Vos) to the voltage value (Vh+Vos) with the cycle of the control signal CLK6. Accordingly, by averaging the detection signal Vdet using the filter 26, the detection signal Vdet is converted to the output voltage Vout whose average voltage value is the voltage Vh as shown by the thick broken line in FIG. 6.

Note that although not illustrated, it is possible for the sensor circuit 8C to use a configuration that uses a differential output-type differential amplifier 21A in the same way as the sensor circuit 8A described above, and to use a configuration where the switches 13 and 14 are omitted, in the same way as the sensor circuit 8B described above.

Also, although a configuration where the Hall element 5 is integrally disposed in the sensor circuit 8, 8A, 8B, or 8C is used in the example described above, it is also possible to use the Hall element driving circuit 1 described above in a sensor circuit where the Hall element 5 is separate. Also, as the switches 11 to 14 and 25b and the switching unit 3, it is possible to use mechanical switches, relays, and semiconductor switches (transistors, FETs, or the like).

Next, the configuration of a current measuring apparatus 101 as the current measuring apparatus shown in FIG. 7 will be described with reference to the drawings.

As one example, the current measuring apparatus 101 includes a Hall element 102, a power supply unit 103, a signal switching unit 104, a switching control unit 105, and a signal processing unit 106, and is configured so as to be capable of detecting a current value Iob of a current flowing in a detected object (for example, a wire), not shown, that is applying a magnetic field, not shown, to the Hall element 102.

The Hall element 102 of the current measuring apparatus 101 is formed in a shape, such as a square or a cross, that has up-down and left-right symmetry when viewed from above and has the four terminals 102a, 102b, 102c, and 102d disposed in the four corners in order in the counterclockwise direction or the clockwise direction (in the example in the present embodiment, the counterclockwise direction). In a state where the driving current I1 is being supplied to an arbitrary pair out of a first terminal pair 102a and 102c and a second terminal pair 102b and 102d of the Hall element 102, a voltage (referred to hereinafter as the "Hall voltage Vh") that is proportional to the magnetic flux density of the magnetic flux passing through the Hall element 102 is produced between the other terminal pair to which the driving current I1 is not supplied in a state where the polarity between the first terminal pair 102a and 102c and the polarity between the second terminal pair 102b and 102d are inverted.

However, the Hall element 102 has a characteristic whereby due to variations during manufacturing, even when the magnetic flux density is zero, in a state where the driving current I1 is supplied to one terminal pair, a substantially constant offset voltage Vos is produced between the other terminal pair. Due to this characteristic, the Hall element 102 outputs a detection voltage Vd that includes the offset voltage Vos in addition to the Hall voltage Vh from the terminal pair to which the driving current I1 is not being supplied.

When superfluous magnetic fields (magnetic fields that are different to the magnetic field from the detected object and whose intensity is constant) are applied to the Hall element 102 together with the magnetic field from the detected object, the Hall element 102 outputs a combined voltage (Vh0+Vh1) including the Hall voltage Vh0 produced due to only the magnetic field from the detected object (hereinafter, the voltage value of the Hall voltage Vh0 is also indicated as "Vh0") and the Hall voltage Vh1 produced due to only the superfluous magnetic fields (hereinafter, the voltage value of the Hall voltage Vh1 is also indicated as "Vh1").

Figure 8:
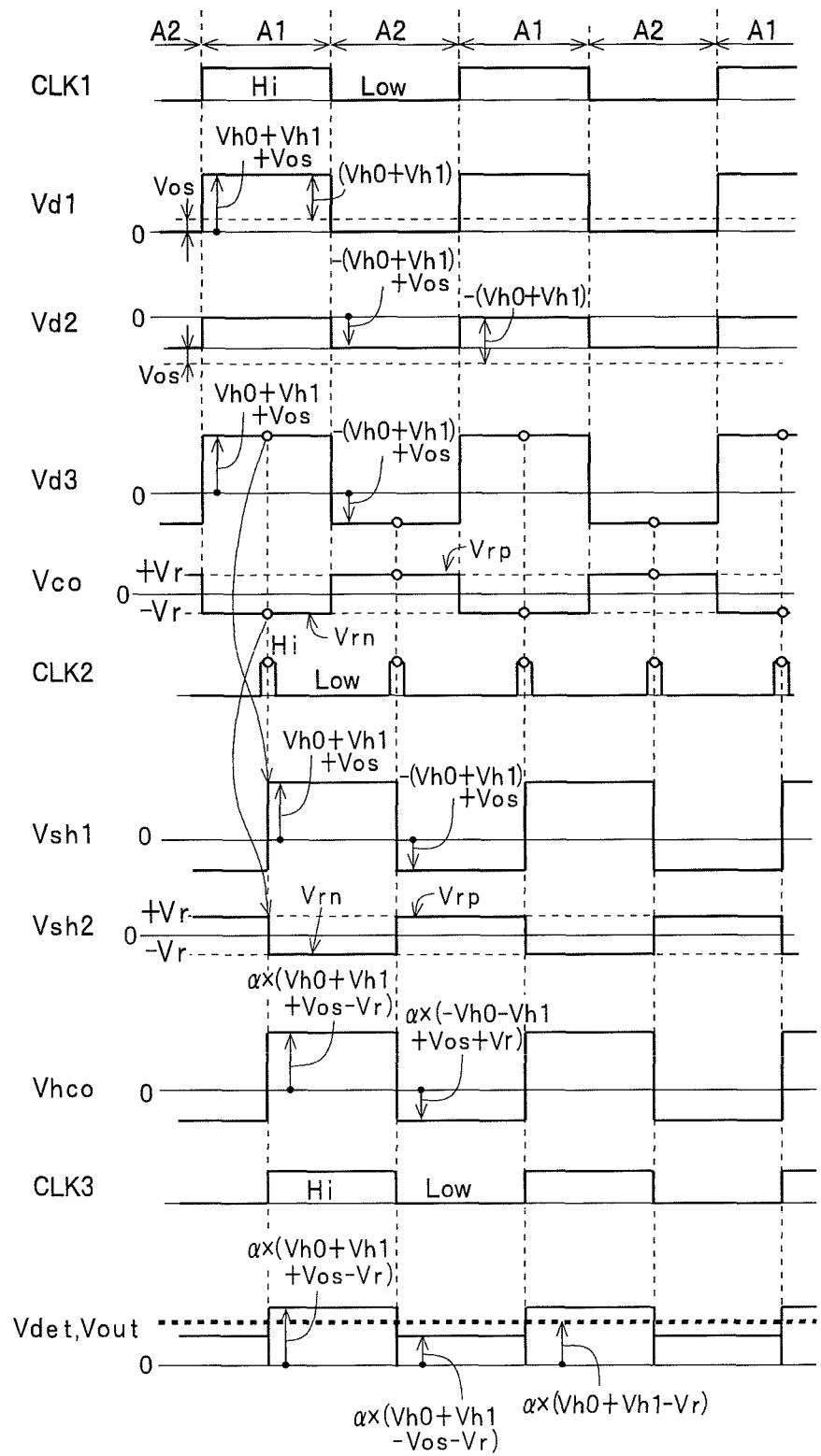
FIG. 8 is a waveform diagram useful in explaining an operation of the current measuring apparatus.

For this reason, out of the detection voltages Vd, the voltage outputted from the first terminal pair 102a and 102c is indicated as the second detection voltage Vd2 (=−(Vh0+Vh1)+Vos) and the voltage outputted from the second terminal pair 102b and 102d is indicated as the first detection voltage Vd1 (=Vh0+Vh1+Vos) (see FIG. 8).

The power supply unit 103 is constructed of a constant-voltage DC power supply or a constant-current DC power supply and outputs a constant voltage or a constant current to the Hall element 102. Although as one example in the present embodiment, the driving current I1 is supplied to the Hall element 102 by constructing the power supply unit 103 of a constant-voltage DC power supply and outputting the constant voltage V1 to the Hall element 102, it is also possible to construct the power supply unit 103 of a constant-current DC power supply and supply the driving current I1 as a constant current to the Hall element 102.

The signal switching unit 104 is configured so as to be capable of switching the supplying of the driving current I1 from the power supply unit 103 to an arbitrary pair out of the first terminal pair 102a and 102c and the second terminal pair 102b and 102d of the Hall element 102 (i.e., switching the flow direction of the driving current I1 to the Hall element 102). Also, the signal switching unit 104 is constructed so as to be capable of switching between the first detection voltage Vd1 produced between the second terminal pair 102b and 102d when the driving current I1 is supplied to the first terminal pair 102a and 102c and the second detection voltage Vd2 produced between the first terminal pair 102a and 102c when the driving current I1 is supplied to the second terminal pair 102b and 102d and outputting to the signal processing unit 106.

More specifically, as one example, the signal switching unit 104 is equipped with four switches (as one example, single pole-double throw switches) 111, 112, 113, and 114, with the switch 111 being disposed between the power supply unit 103 and the Hall element 102 by connecting the c contact of the switch 111 to the power supply unit 103, connecting the a contact to one terminal 102a out of the first terminal pair 102a and 102c and connecting the b contact to the terminal 102d out of the second terminal pair 102b and 102d. The switch 112 is disposed between the reference potential (the ground G, whose voltage is zero volts) of the current measuring apparatus 101 and the Hall element 102 by connecting the c contact of the switch 112 to the reference potential (the ground G), connecting the a contact to the other terminal 102c out of the first terminal pair 102a and 102c and connecting the b contact to the other terminal 102b out of the second terminal pair 102b and 102d.

The switch 113 is disposed between the signal processing unit 106 and the Hall element 102 by connecting the c contact of the switch 113 to the signal processing unit 106 (more specifically, to a non-inverting input terminal that constructs the pair of input terminals of a differential amplifier 121 as a differential amplification circuit that constructs part of the signal processing unit 106), connecting the a contact to one terminal 102d out of the second terminal pair 102b and 102d, and connecting the b contact to one terminal 102a of the first terminal pair 102a and 102c. The switch 114 is also disposed between the signal processing unit 106 and the Hall element 102 by connecting the c contact of the switch 114 to the signal processing unit 106 (more specifically, to an inverting input terminal that constructs the pair of input terminals of the differential amplifier 121 that constructs part of the signal processing unit 106), connecting the a contact to the other terminal 102b out of the second terminal pair 102b and 102d, and connecting the b contact to the other terminal 102c out of the first terminal pair 102a and 102c. These switches 111 to 114 are controlled so that the a contacts are connected to the c contacts during the Hi level period (the periods A1 shown in FIG. 8) of the control signal CLK1 outputted from the switching control unit 105 (i.e., there is a transition to the connected state shown by the solid lines in the drawing) and the b contacts are connected to the c contacts during the Low level period (the periods A2 shown in FIG. 8) of the control signal CLK1 (i.e., there is a transition to the connected state shown by the broken lines in the drawing).

The switching control unit 105 generates three control (switching) signals CLK1, CLK2, and CLK3 with the timing shown in FIG. 8, outputs the control signal CLK1 to the switches 111, 112, 113, and 114 and to the signal processing unit 106 (more specifically, to a correction voltage output circuit 122 described later that constructs part of the signal processing unit 106), outputs the control signal CLK2 to the signal processing unit 106 (more specifically, to the two sample and hold circuits 123 and 124 described later that construct part of the signal processing unit 106), and outputs the control signal CLK3 to the signal processing unit 106 (more specifically, a synchronous detection circuit 126 that constructs part of the signal processing unit 106).

As one example in the present embodiment, the switching control unit 105 outputs the control signal CLK1 as a pulse signal with a constant frequency (for example, several tens of kHz (as one example, 40 kHz)) and a duty ratio of 0.5. Also, the switching control unit 105 outputs the control signal CLK2 as a pulse signal with a frequency that is double the frequency of the control signal CLK1 and as one example has a Hi level only for a predetermined time (a time that is sufficiently shorter than the Hi level period and Low level period of the control signal CLK1) with timing that is substantially midway in each of the Hi level periods and Low level periods of the control signal CLK1 and has a Low level the rest of the time. The switching control unit 105 outputs the control signal CLK3 as a pulse signal that has the same frequency as the control signal CLK1 and has a state that switches between a Hi level and a Low level in synchronization with the output timing of the control signal CLK2.

The signal processing unit 106 is equipped with the differential amplifier 121, the correction voltage output circuit 122, the sample and hold circuits 123 and 124, an adder circuit 125, the synchronous detection circuit 126, a filter 127, an A/D convertor 128, and a computing circuit 129, and by carrying out signal processing on the first detection voltage Vd1 and the second detection voltage Vd2 (i.e., by executing signal processing that cancels out the offset voltage Vos of the Hall element based on the first detection voltage Vd1 and the second detection voltage Vd2 and signal processing that corrects (removes) the Hall voltage Vh1 detected based only on superfluous magnetic fields), detects the current value Iob in a state where the influence of the offset voltage Vos and the Hall voltage Vh1 has been removed.

More specifically, the non-inverting input terminal of the differential amplifier 121 is connected to the c contact of the switch 113 and the inverting input terminal is connected to the c contact of the switch 114. As one example, by having the gain set at 1, the differential amplifier 121 outputs one voltage out of the first detection voltage Vd1 and the second detection voltage Vd2 outputted via the switches 113 and 114 (i.e., a voltage selected by the switches 113 and 114) as the third detection voltage Vd3. By doing so, as shown in FIG. 8, the differential amplifier 121 outputs the third detection voltage Vd3 that is the first detection voltage Vd1 (voltage value: Vh0+Vh1+Vos) as a positive voltage during the Hi level period of the control signal CLK1 (the period A1 in FIG. 8) and the second detection voltage Vd2 (voltage value: −(Vh0+Vh1)+Vos) as a negative voltage during the Low level period of the control signal CLK1 (the period A2 in FIG. 8), that is, the first detection voltage Vd1 and the second detection voltage Vd2 are alternately outputted at constant intervals (half the cycle of the cycle of the control signal CLK1).

The correction voltage output circuit 122 outputs a correction voltage Vco capable of adjusting the voltage value Vr. As one example, the correction voltage output circuit 122 is equipped with a variable power supply 122a, a switch 122b, and a capacitor 122c, and as shown in FIG. 8, outputs a positive correction voltage Vrp and a negative correction voltage Vrn whose absolute values are adjusted to the voltage value Vr as the correction voltage Vco in synchronization with the control signal CLK1.

More specifically, the variable power supply 122a outputs a DC voltage Vdc whose voltage value (2×Vr) is double the voltage value Vr. The variable power supply 122a is also equipped with an adjusting means such as a volume knob for adjusting the voltage value (2×Vr). As one example, the switch 122b is configured with the same single-pole double-throw switch as the switches 111, 112, 113, and 114 of the signal switching unit 104, with the a contact being connected to the positive output terminal of the variable power source 122a, the b contact being connected to the negative output terminal of the variable power supply 122a (the reference potential (ground G) of the current measuring apparatus 101), and the c contact being connected to one terminal of the capacitor 122c. The switch 122b is controlled so that the b contact is connected to the c contact during Hi level periods of the control signal CLK1 outputted from the switching control unit 105 (i.e., there is a transition to the connected state shown by the solid line in the drawing) and so that the a contact is connected to the c contact during Low level periods of the control signal CLK1 (i.e., there is a transition to the connected state shown by the broken line in the drawing).

With this configuration, although not illustrated, a voltage signal (pulse signal) with a duty ratio of 0.5 and a voltage value that is zero volts during Hi level periods of the control signal CLK1 and a voltage value (2×Vr) during Low level periods of the control signal CLK1 is generated at one terminal of the capacitor 122c. The capacitor 122c removes the DC component included in such voltage signal and outputs from the other terminal. By doing so, as shown in FIG. 8, the correction voltage output circuit 122 outputs the correction voltage Vco that has a duty ratio of 0.5 and has a negative correction voltage Vrn with the voltage value −Vr during Hi level periods of the control signal CLK1 and a positive correction voltage Vrp with the voltage value Vr during Low level periods of the control signal CLK1 from the other terminal of the capacitor 122c.

The sample and hold circuit 123 samples (detects and holds) the voltage of the third detection voltage Vd3 during a Hi level period of the control signal CLK2 and outputs as the sampling voltage Vsh1. That is, the sample and hold circuit 123 outputs the third detection voltage Vd3 that is synchronized with the timing of the control signal CLK2 as the sampling voltage Vsh1. On the other hand, the sample and hold circuit 124 samples (detects and holds) the voltage of the correction voltage Vco during a Hi level period of the control signal CLK2 and outputs as the sampling voltage Vsh2. That is, the sample and hold circuit 124 outputs the correction voltage Vco synchronized with the timing of the control signal CLK2 as the sampling voltage Vsh2.

In this way, since the current measuring apparatus 101 is configured so as to sample (detect and hold) the third detection voltage Vd3 in synchronization with the control signal CLK2 outputted at timing that is shifted with respect to the timing of rises and falls in the third detection voltage Vd3, that is, the timing of rises and falls in the control signal CLK1, there is a great reduction in the effect on the sampling voltages Vsh1 and Vsh2 of noise, which has the risk of being produced in the first detection voltage Vd1 and the second detection voltage Vd2 (and in turn, in the third detection voltage Vd3) when the driving current I1 supplied to the Hall element 102 is switched at the timing of rises and falls in the control signal CLK1.

Note that it is also possible, when the influence of noise produced when switching the driving current I1 is negligible, to use a configuration that omits sampling of the third detection voltage Vd3 according to the control signal CLK2. With this configuration, the sample and hold circuits 123 and 124 are omitted from the component elements of the current measuring apparatus 101 shown in FIG. 7, the third detection voltage Vd3 and the correction voltage Vco are inputted into the adder circuit 125 in place of the sampling voltages Vsh1 and Vsh2, and synchronous detection is carried out by the synchronous detection circuit 126 according to the control signal CLK1 in place of the control signal CLK3.

By adding the sampling voltage Vsh1 (the third detection voltage Vd3 synchronized with the timing of the control signal CLK2) and the sampling voltage Vsh2 (the correction voltage Vco synchronized with the timing of the control signal CLK2) and amplifying by a known gain a (normally around several tens), as shown in FIG. 8 the adder circuit 125 alternately outputs a corrected first detection voltage (voltage value: $\alpha \times$(Vh0+Vh1+Vos−Vr)) where the first detection voltage Vd1 (voltage value: Vh0+Vh1+Vos) in the sampling voltage Vsh1 is corrected using the negative correction voltage (voltage value: −Vr) and multiplied by a and a corrected second detection voltage (voltage value: $\alpha \times$(−Vh0−Vh1+Vos+Vr)) where the second detection voltage Vd2 (voltage value: −Vh0−Vh1+Vos) is corrected using the positive correction voltage (voltage value: Vr) and multiplied by a as a corrected Hall voltage Vhco (=$\alpha \times$(Vsh1+Vsh2)).

As one example in the present embodiment, the adder circuit 125 is constructed as an analog amplification circuit (a circuit where the gain of the entire circuit is set at a) equipped with an inverting amplifier 131 that adds and outputs the sampling voltages Vsh1 and Vsh2 and an amplifier 132 that outputs the corrected Hall voltage Vhco by inputting the signal outputted from the inverting amplifier 131 and amplifying (in the present embodiment, inverting amplification) by a gain that is set in advance. In this case, the inverting amplifier 131 includes an operational amplifier 131a whose non-inverting input terminal is connected to the ground G, an input resistor 131b that is connected between the inverting input terminal of the operational amplifier 131a and an output terminal, not shown, of the sample-and-hold circuit 123, an input resistor 131c (a resistor with the same resistance value as the input resistor 131b) that is connected between the inverting input terminal of the operational amplifier 131a and an output terminal, not shown, of the sample-and-hold circuit 124, and a feedback resistor 131d connected between the inverting input terminal and the output terminal of the operational amplifier 131a. In the adder circuit 125, the overall gain a of the inverting amplifier 131 and the amplifier 132 is set so that the level of the corrected Hall voltage Vhco can be amplified to a level that matches the input rating of an A/D converter 128 that comes next. Note that the adder circuit 125 is not limited to this configuration and it is possible to use a variety of known configurations.

Figure 7:
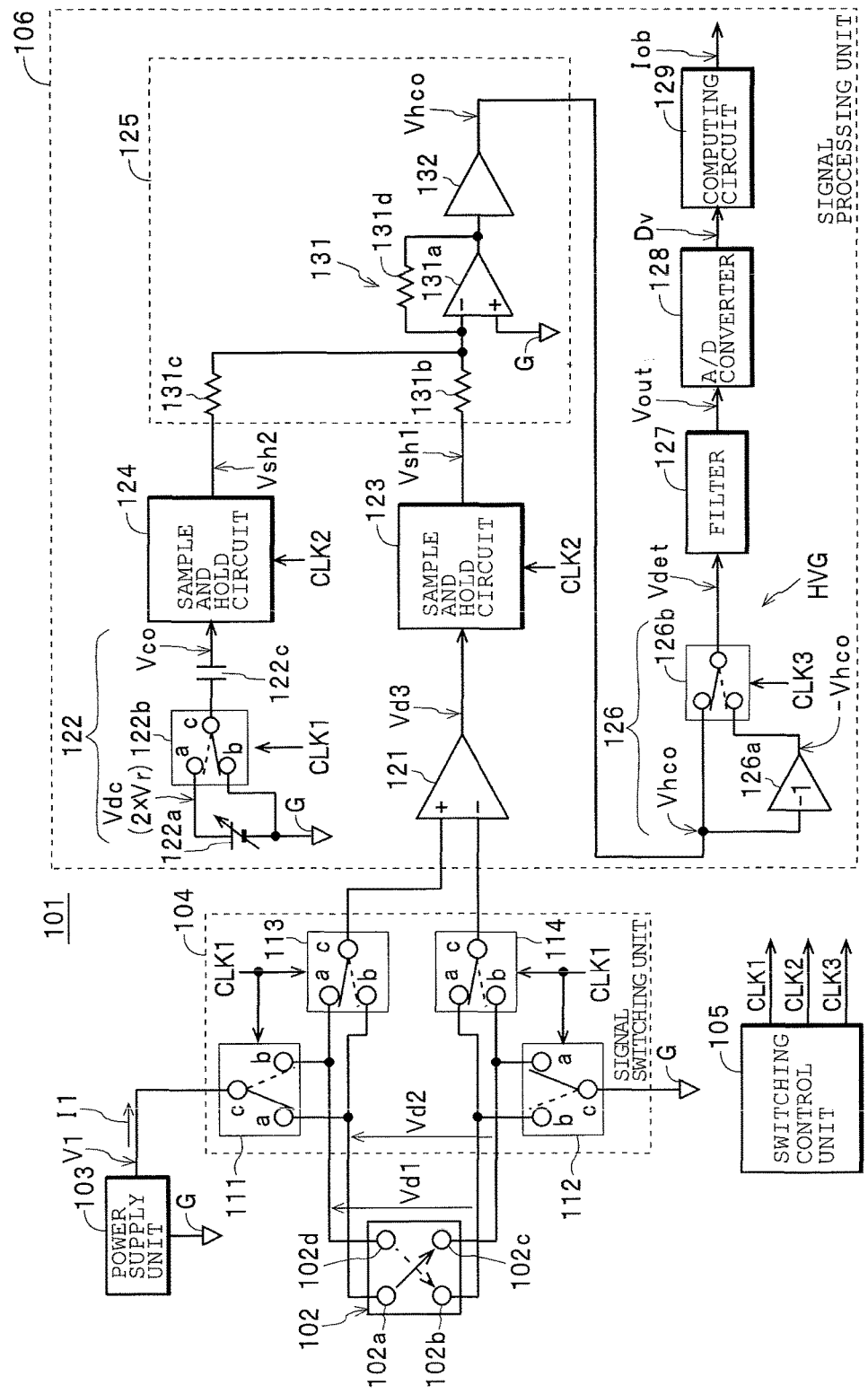
FIG. 7 is a block diagram of a current measuring apparatus.

As one example, as shown in FIG. 7, the synchronous detection circuit 126 is equipped with an amplifier 126a that inputs the corrected Hall voltage Vhco, amplifies with a gain of −1, and outputs as the inverted Hall voltage −Vhco and a switch 126b that inputs the Hall voltage Vhco and the inverted Hall voltage −Vhco and alternately switches between the voltages Vhco and −Vhco in synchronization with the control signal CLK3 (that is, the Hall voltage Vhco is detected in synchronization with the control signal CLK3) and outputs as the detection signal Vdet (as one example in the present embodiment, the switch 126b is composed of a single pole-double throw switch in the same way as the switch 111 and the like). As shown in FIG. 8, as one example, the switch 126b outputs the detection signal Vdet by switching to the Hall voltage Vhco during a Hi level period of the control signal CLK3 (voltage value: α×(Vh0+Vh1+Vos−Vr)) and switching to the inverted Hall voltage −Vhco during a Low level period of the control signal CLK3 (voltage value: α×(−Vh0−Vh1+Vos+Vr)).

The filter 127 outputs the output voltage Vout by inputting and averaging the detection signal Vdet. Here, as shown in FIG. 8, the detection signal Vdet outputted from the synchronous detection circuit 126 is a signal whose voltage value has transitions as described above from the voltage value (α×(Vh0+Vh1+Vos−Vr)) to the voltage value (α×(Vh0+Vh1−Vos−Vr)) and from the voltage value (α×(Vh0+Vh1−Vos−Vr)) to the voltage value (α×(Vh0+Vh1+Vos−Vr)) in half cycles of the control signal CLK3. Accordingly, by averaging the detection signal Vdet using the filter 127, the detection signal Vdet is converted to the output voltage Vout (DC voltage) whose voltage (α×(Vh0+Vh1−Vr)) has the average voltage value shown by the thick broken line in FIG. 8. That is, the output voltage Vout in which a component equivalent to the offset voltage Vos has been canceled out is outputted from the filter 127. As described above, the signal processing unit 106 includes a Hall voltage generating circuit HVG constructed of an analog circuit including the differential amplifier 121, the sample and hold circuit 123, the adder circuit 125, the synchronous detection circuit 126, and the filter 127, as well as the correction voltage output circuit 122 and the sample and hold circuit 124 that are constructed of analog circuits.

The A/D converter 128 outputs digital data Dv showing the voltage value of the output voltage Vout by sampling the output voltage Vout with a predetermined sampling cycle. The computing circuit 129 is composed of a computer, for example, and executes a current detecting process that detects (calculates) the current value Iob of the current flowing in the detected object based on the digital data Dv inputted from the A/D converter 128. Also, the computing circuit 129 executes an output process that outputs the calculated current value Iob. The outputting referred to here is capable of taking a variety of forms, such as displaying on a display unit, not shown, storing in a storage unit (for example, a hard disk drive apparatus or a removable medium) and transferring to an external appliance.

Next, the operation of the current measuring apparatus 101 (an operation that detects the current value Iob of the current flowing in the detected object) will be described with reference to the drawings.

In the current measuring apparatus 101, the power supply unit 103 executes the outputting of the constant voltage V1 and the switching control unit 105 outputs the control signals CLK1 to CLK3 as shown in FIG. 8 with the timing described above.

In this state, the operator of the current measuring apparatus 101 executes a correction voltage setting process that sets the voltage value Vr of the correction voltage Vco as one adjustment task for the current measuring apparatus 101 executed before the task of detecting the current to be detected. In the correction voltage setting process, first, the current measuring apparatus 101 is placed in a state where the magnetic field from the detected object is not applied to the Hall element 102. That is, the Hall voltage Vh0 described above is set in a zero state. Note that even in this state, superfluous magnetic fields of a constant strength are continuously applied to the Hall element 102. For this reason, the Hall element 102 outputs the Hall voltage Vh1 described above at a constant Hall voltage value Vh1.

Next, in the correction voltage setting process, the operator operates an adjusting means provided on the variable power supply 122a of the signal processing unit 106 while monitoring the output voltage Vout outputted from the filter 127 of the signal processing unit 106 of the current measuring apparatus 101 using a voltmeter or the like, and adjusts the voltage value (2×Vr) of the DC voltage Vdc outputted from the variable power supply 122a to set the output voltage Vout at zero volts (or a state extremely close to zero volts). As shown in FIG. 8, the output voltage Vout is outputted in a state where a component equivalent of the offset voltage Vos is canceled out (a state where the voltage value is α×(Vh0+Vh1−Vr)). Also, while executing the correction voltage setting process, the Hall voltage Vh0 is zero as described above. This means that by adjusting the voltage value (2×Vr) of the DC voltage Vdc to set the output voltage Vout at zero volts, it is possible to match (or substantially match) the voltage value Vr of the correction voltage Vco to the voltage value of the Hall voltage Vh1. That is, it is possible to cancel out the Hall voltage Vh1 using the correction voltage Vco. By doing so, the correction voltage setting process is completed.

In this way, since the current measuring apparatus 101 is configured to execute, at a stage before the amplifier 132, an operation that corrects (cancels out) the Hall voltage Vh1 generated in the Hall element 102 due to superfluous magnetic fields to zero or a value extremely close to zero using the correction voltage Vco, it is possible to avoid a state where the adder circuit 125 and analog circuits that come after the adder circuit 125 become saturated due to the presence of the Hall voltage Vh1.

However, since there are limits on the output precision of the DC voltage Vdc of the variable power supply 122a and the measurement precision of the voltmeter that monitors the output voltage Vout, it is difficult to precisely match the voltage value Vr of the correction voltage Vco to the voltage value Vh1 of the Hall voltage Vh1. Accordingly, the voltage value (Vh1−Vr) exists in a state that is not completely zero and has an error voltage value of a certain value. The current measuring apparatus 101 is also equipped with a function that cancels out this error voltage value (Vh1−Vr) using data processing at the computing circuit 129.

Accordingly, the operator of the current measuring apparatus 101 executes, as another adjustment task for the current measuring apparatus 101, a correction data storing process that acquires correction voltage data for cancelling out the error voltage value (Vh1−Vr) after executing the correction voltage setting process described above.

In this correction data storing process, the operator operates a zero adjustment start button, for example, disposed on an operation unit, not shown, to cause the computer of the computing circuit 129 to execute an acquisition process that acquires correction voltage data Dvc. In this acquisition process, the computer of the computing circuit 129 acquires digital data Dv (digital data showing the voltage value of the output voltage Vout) outputted from the A/D converter 128 and stores in an internal memory as the correction voltage data Dvc. The correction voltage data Dvc shows a voltage value produced by multiplying the error voltage value (Vh1−Vr) that exists with a certain value after execution of the correction voltage setting process by a. By doing so, the acquisition process is completed and the correction data storage process is also completed.

After completing the preprocessing described above, the operator sets the current measuring apparatus 101 in a state where a magnetic field from the detected object is applied to the Hall element 102 to execute a detection process for the current value Iob of the current flowing in the detected object Here, superfluous magnetic fields are applied to the Hall element 102 together with the magnetic field from the detected object. For this reason, the Hall element 102 outputs that Hall voltage Vh that is a combined voltage (Vh0+Vh1) of the Hall voltage Vh0 produced due to only the magnetic field from the detected object and the Hall voltage Vh1 produce due to only the superfluous magnetic fields. Accordingly, the first detection voltage Vd1 and the second detection voltage Vd2 whose voltage values change during the periods A1 and A2 as shown in FIG. 8 are outputted from the signal switching unit 104 to the signal processing unit 106.

By doing so, in the signal processing unit 106, the differential amplifier 121 outputs the third detection voltage Vd3 whose voltage value changes in each period A1 and A2 as shown in FIG. 8 based on the first detection voltage Vd1 and the second detection voltage Vd2 and, by sampling the third detection voltage Vd3 according to the control signal CLK2, the sample and hold circuit 123 outputs the sampling voltage Vsh1 whose voltage value changes as shown in FIG. 8 in synchronization with the control signal CLK2 from Vh0+Vh1+Vos to −(Vh0+Vh1)+Vos and −(Vh0+Vh1)+Vos to Vh0+Vh1+Vos.

On the other hand, in the current measuring apparatus 101, as shown in FIG. 8, the correction voltage output circuit 122 outputs the correction voltage Vco whose voltage value −Vr is the negative correction voltage Vrn during the Hi level period of the control signal CLK1 and whose voltage value Vr is the positive correction voltage Vrp during the Low level period of the control signal CLK1. The sample and hold circuit 124 samples the correction voltage Vco according to the control signal CLK2 and, as shown in FIG. 8, outputs the sampling voltage Vsh2 whose voltage value changes from +Vr to the −Vr and from −Vr to +Vr in synchronization with the control signal CLK2.

Here, in the current measuring apparatus 101, in the correction voltage setting process described above, the voltage value Vr of the correction voltage Vco is matched (or substantially matched) to the voltage value of the Hall voltage Vh1. Here, as one example, a state where the values substantially match (Vr≈Vh1) is assumed.

By doing so, in the signal processing unit 106, in a state where (Vh1−Vr)≈0, that is, in a state where the occurrence of saturation due to the presence of the Hall voltage Vh1 is avoided (or is greatly reduced) using the correction voltage Vco, the adder circuit 125 outputs the corrected Hall voltage Vhco whose voltage value changes as shown in FIG. 8 from α×(Vh0+Vh1+Vos−Vr) to α×(−Vh0−Vh1+Vos+Vr) and from α×(−Vh0−Vh1+Vos+Vr) to α×(Vh0+Vh1+Vos−Vr) in synchronization with the control signal CLK2.

In the signal processing unit 106, next, by carrying out synchronous detection of the Hall voltage Vhco according to the control signal CLK3, the synchronous detection circuit 126 outputs the detection signal Vdet whose voltage value changes from α×(Vh0+Vh1+Vos−Vr) to α×(Vh0+Vh1−Vos−Vr) and from α×(Vh0+Vh1−Vos−Vr) to α×(Vh0+Vh1+Vos−Vr) in synchronization with the control signal CLK3.

By inputting and averaging the detection signal Vdet, the filter 127 outputs the output voltage Vout (=α×(Vh0+Vh1−Vr)) in which a component equivalent to the offset voltage Vos is cancelled out. Next, by carrying out A/D conversion on the output voltage Vout, the A/D converter 128 converts to the digital data Dv showing the voltage value of the output voltage Vout and outputs to the computing circuit 129.

Finally, in the signal processing unit 106, the computing circuit 129 executes a current detecting process based on the digital data Dv to detect (calculate) the current value Iob of the current flowing in the detected object. Here, although close to zero, an error voltage value caused by the Hall voltage Vh1 shown by α×(Vh1−Vr) is included in the output voltage Vout (=α×(Vh0+Vh1−Vr)) indicated by the digital data Dv inputted by the computing circuit 129 from the A/D converter 128.

For this reason, in the current detecting process, the computing circuit 129 first subtracts the correction voltage data Dvc (voltage α×(Vh1−Vr) that has been stored in advance in an internal memory by the correction data storing process described above from the digital data Dv. By doing so, voltage data showing the voltage (α×Vh0) from which the error voltage value α×(Vh1−Vr) has been removed, that is, voltage data composed of only the Hall voltage Vh0 produced due to only the magnetic field from the detected object, is calculated. Next, the computing circuit 129 detects (calculates) the current value Iob of the current flowing in the detected object based on the voltage data showing such voltage (α×Vh0). Finally, the computing circuit 129 outputs the detected current value Iob by executing the output process.

In this way, in the current measuring apparatus 101, the signal processing unit 106 is equipped with the Hall voltage generating circuit HVG, which includes the correction voltage output circuit 122 that outputs the correction voltage Vco whose the voltage value Vr can be adjusted and the adder circuit 125 that adds the correction voltage Vco to the voltage (in the present embodiment, the third detection voltage Vd3) generated by signal processing on the first detection voltage Vd1 and the second detection voltage Vd2 and which corrects the Hall voltage Vh, and is configured so as to be capable of adjusting the voltage value Vr of the correction voltage Vco so that the Hall voltage Vh (the corrected Hall voltage Vhco in the example described above) that has been corrected by the Hall voltage generating circuit HVG is zero when the magnetic field from the detected object is not being applied to the Hall element 102. Also, with the current measuring apparatus 101, the computing circuit 129 calculates the current value Iob of the current flowing in the detected object based on the corrected Hall voltage Vhco.

Accordingly, with the current measuring apparatus 101, it is possible to cancel out (or greatly reduce) the Hall voltage Vh1 produced due to only the superfluous magnetic fields using the correction voltage Vco while cancelling out the offset voltage Vos with a conventional method (i.e., a method that cancels out the offset voltage Vos by signal processing of the first detection voltage Vd1 and the second detection voltage Vd2 detected by switching the terminal pairs of the Hall element 102 that are supplied with the driving current I1). This means that with the current measuring apparatus 101, it is possible to calculate the current value Iob of the current flowing in the detected object with high precision while avoiding saturation due to the Hall voltage Vh1 in the Hall voltage generating circuit HVG constructed of analog circuits that execute signal processing on the Hall voltage Vh (the first detection voltage Vd1 and the second detection voltage Vd2) outputted from the Hall element 102.

Also, in the current measuring apparatus 101, the signal processing unit 106 is equipped with the differential amplifier 121 as a differential amplification circuit whose pair of input terminals are connected between the second terminal pair 102b and 102d when the signal switching unit 104 is in the first switching state and whose pair of input terminals are connected between the first terminal pair 102a and 102c when the signal switching unit 104 is in the second switching state and outputs, from an output terminal thereof, the first detection voltage Vd1 as a positive voltage and the second detection voltage Vd2 as a negative voltage alternately for constant time intervals as the third detection voltage Vd3, the correction voltage output circuit 122 alternately outputs the positive correction voltage Vrp and the negative correction voltage Vrn, whose respective absolute values are equal, in synchronization with the third detection voltage Vd3 as the correction voltage Vco, and the Hall voltage generating circuit HVG outputs, by having the adder circuit 125 add the third detection voltage Vd3 and the correction voltage Vco, the corrected Hall voltage Vhco in which the first detection voltage Vd1 (=Vh0+Vh1+Vos) has been corrected by adding the negative correction voltage Vrn (=−Vr) and the second detection voltage Vd2 (=−(Vh0+Vh1)+Vos) has been corrected by adding the positive correction voltage Vrp (=Vr).

The corrected Hall voltage Vhco is a voltage where a corrected first detection voltage (voltage value: α×(Vh0+Vh1+Vos−Vr)) where the first detection voltage Vd1 has been corrected by the negative correction voltage Vrn and a corrected second detection voltage (voltage value: α×(−Vh0−Vh1+Vos+Vr)) where the second detection voltage Vd2 has been corrected by the positive correction voltage Vrp are alternately outputted (in the present embodiment, in synchronization with the timing of the control signal CLK2).

Accordingly, with the current measuring apparatus 101, by adjusting the voltage value Vr of the correction voltage Vco to the same as the voltage value of the Hall voltage Vh1, it is possible to accurately correct the third detection voltage Vd3 using the voltage value Vr in a state where the voltage value changes from Vh0+Vh1+Vos to −Vh0−Vh1+Vos and from −Vh0−Vh1+Vos to Vh0+Vh1+Vos in synchronization with the timing of the control signal CLK2. That is, it is possible to correct the voltage value of the corrected first detection voltage described above outputted in synchronization with the timing of the control signal CLK2 to substantially α×(Vh0+Vos) and the voltage value of the corrected second detection voltage to substantially α×(−Vh0+Vos). This means that in the Hall voltage generating circuit HVG constructed of analog circuits including the adder circuit 125, it is possible to output the Hall voltage Vhco in which the Hall voltage Vh1 has been substantially cancelled out while avoiding saturation due to the Hall voltage Vh1.

Also, with the current measuring apparatus 101, the signal processing unit 106 is equipped with the A/D convertor 128 that carries out A/D conversion on the corrected Hall voltage Vhco and the computing circuit 129 that acquires the digital data Dv outputted from the A/D converter 128, and the computing circuit 129 stores the digital data Dv when the magnetic field from the detected object is not applied to the Hall element 102 as the correction voltage data Dvc and calculates the current value Iob based on the data obtained by correcting the digital data Dv for when a magnetic field from the detected object is applied to the Hall element 102 using the correction voltage data Dvc.

Accordingly, with the current measuring apparatus 101, even if the voltage value Vr of the correction voltage Vco and the voltage value Vh1 of the Hall voltage Vh1 slightly differ, since it is possible to completely cancel out the influence of the Hall voltage Vh1, it is possible to calculate the current value Iob with higher precision.

Also, with the current measuring apparatus 101, the correction voltage output circuit 122 is equipped with the variable power supply 122a constructed so as to be capable of adjusting the voltage value (2×vr) of the DC voltage Vdc that is the output voltage, the switch 122b that switches between and outputs the DC voltage Vdc and zero volts (the ground G potential) at constant time intervals, and the capacitor 122c that removes the DC component included in the output from the switch 122b and outputs as the correction voltage Vco. Accordingly, with the current measuring apparatus 101, it is possible to easily and reliably generate and output, using simple circuits, the correction voltage Vco that changes from the negative correction voltage Vrn to the positive correction voltage Vrp (that is, the voltage value changes from −Vr to +Vr) and changes from the positive correction voltage Vrp to the negative correction voltage Vrn (that is, the voltage value changes from +Vr to −Vr) in synchronization with the timing of the control signal CLK1. Also, according to the correction voltage output circuit 122, by adjusting the voltage value (2×vr) of the variable power supply 122a, it is possible to simultaneously change the voltage values of the positive correction voltage Vrp and the negative correction voltage Vrn that have different polarities in a state where the absolute values of the voltages match.

Note that although the current measuring apparatus 101 described above uses a configuration where, in the signal processing unit 106, the synchronous detection circuit 126 outputs the detection signal Vdet as shown in FIG. 8 based on the third detection voltage Vd3 outputted from the differential amplifier 121 and the detection signal Vdet is averaged at the filter 127 to cancel out a component equivalent to the offset voltage Vos, the configuration for cancelling out a component equivalent to the offset voltage Vos is not limited to this.

Figure 9:
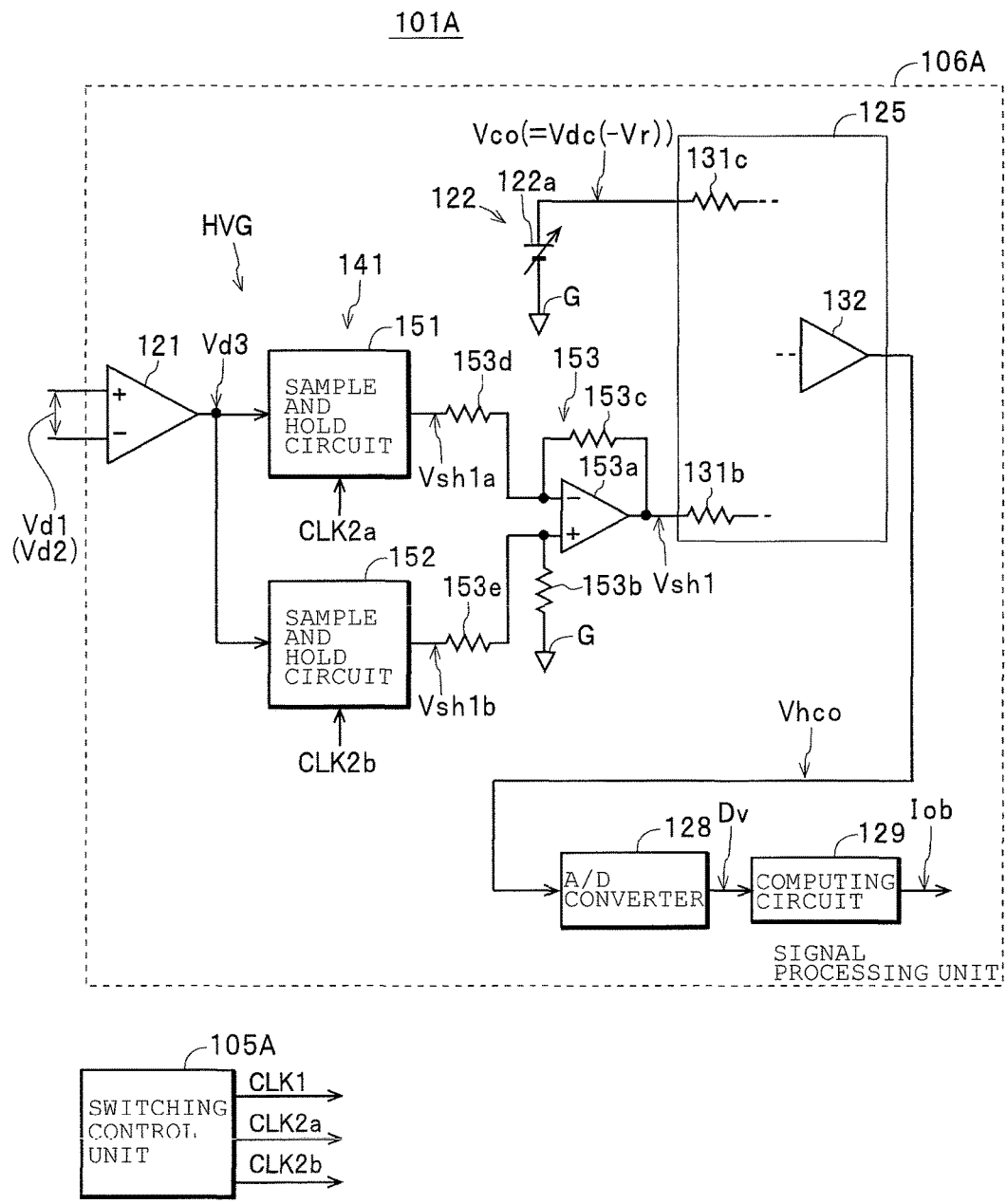
FIG. 9 is a block diagram of another current measuring apparatus.

As one example, it is possible to configure a current measuring apparatus 101A equipped with a switching control unit 105A and a signal processing unit 106A shown in FIG. 9 in place of the switching control unit 105 and the signal processing unit 106 of the current measuring apparatus 101. Note that since the Hall element 102, the power supply unit 103, and the signal switching unit 104 are the same as the current measuring apparatus 101, such elements are not illustrated. Also, configurations of the switching control unit 105A and the signal processing unit 106A that are the same as the switching control unit 105 and the signal processing unit 106 have been assigned the same reference numerals and duplicated description thereof is omitted. Also, since the adder circuits 125 of the signal processing unit 106 and the signal processing unit 106A have the same configurations, such elements are omitted from FIG. 9 (this also applies to FIGS. 11 and 12 described later).

Figure 10:
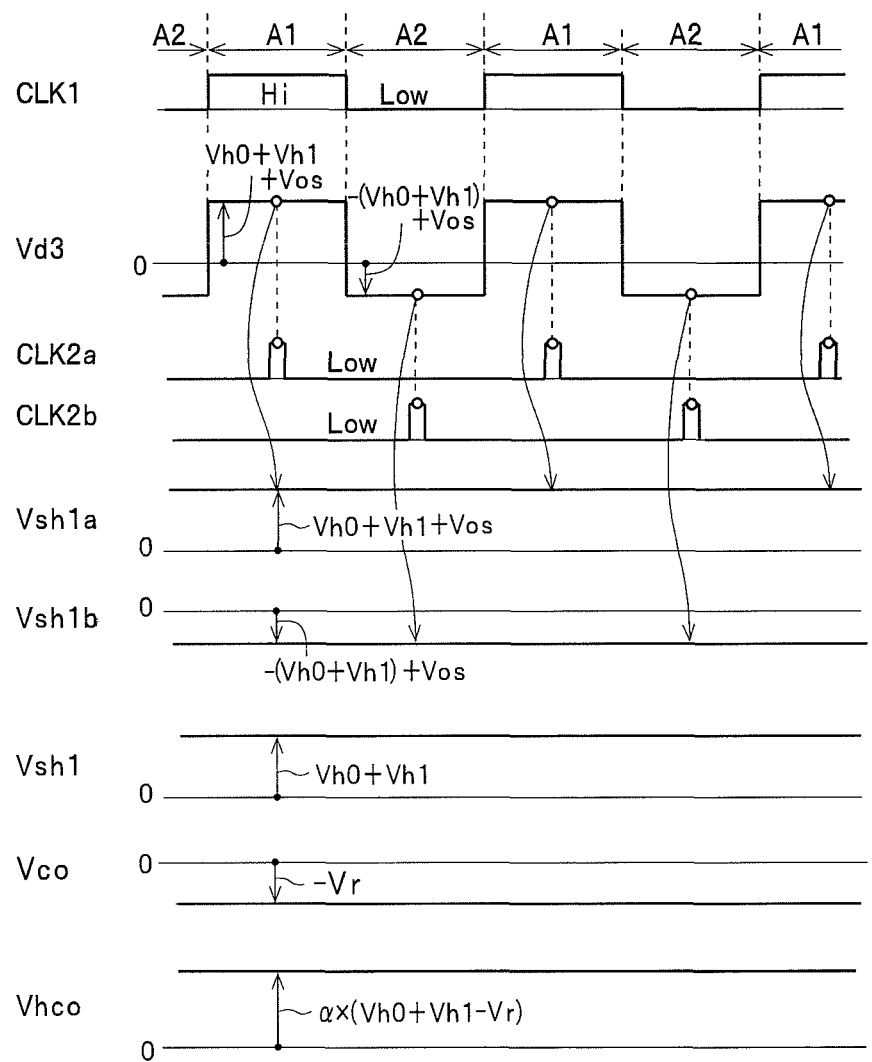
FIG. 10 is a waveform diagram useful in explaining an operation of the other current measuring apparatus.

The switching control unit 105A outputs the control signal CLK1 and the control signals CLK2a and CLK2b with the timing shown in FIG. 10. In this case, to reduce the effects of the noise described above that has the risk of being produced at the timing of rises and falls in the control signal CLK1, in the same way as the control signal CLK2, the switching control unit 105A outputs the control signals CLK2a and CLK2b at timing that is substantially midway during periods corresponding to Hi level periods and Low level periods of the control signal CLK1.

As one example, the signal processing unit 106A is equipped with the differential amplifier 121, the correction voltage output circuit 122, an offset cancelling circuit 141, the adder circuit 125, the A/D converter 128, and the computing circuit 129, and, based on the first detection voltage Vd1 and the second detection voltage Vd2, executes signal processing that cancels out the offset voltage Vos of the Hall element 102 and the Hall voltage Vh1 and detects the current value Iob.

The offset cancelling circuit 141 is equipped with sample and hold circuits 151 and 152 and a subtraction circuit 153, and outputs the sampling voltage Vsh1 that is proportional to the magnetic flux density of magnetic flux (i.e., magnetic flux due to a magnetic field from the detected object and/or superfluous magnetic fields) passing through the Hall element 102.

In this case, by inputting the third detection voltage Vd3 and sampling in synchronization with the control signal CLK2a, as shown in FIG. 10 the sample and hold circuit 151 outputs the sampling voltage Vsh1a (DC voltage) whose voltage value is (Vh0+Vh1+Vos) during the period A1 for the third detection voltage Vd3. By inputting the third detection voltage Vd3 and sampling in synchronization with the control signal CLK2b, as shown in FIG. 10 the sample and hold circuit 152 outputs the sampling voltage Vsh1b (DC voltage) whose voltage value is −(Vh0+Vh1)+Vos during the period A2 for the third detection voltage Vd3.

The subtraction circuit 153 is equipped with an operational amplifier 153a, a grounding resistor 153b connected between the non-inverting input terminal of the operational amplifier 153a and the ground G, a feedback resistor 153c connected between the inverting input terminal of the operational amplifier 153a and the output terminal, an input resistor 153d connected between the inverting input terminal of the operational amplifier 153a and the output terminal of the sample and hold circuit 151, and an input resistor 153e connected between the non-inverting input terminal of the operational amplifier 153a and the output terminal of the sample and hold circuit 152. The subtraction circuit 153 is set so that the gain of the operational amplifier 153a has a low gain of around 1, the resistance values of the resistors 153b and 153c are the same so that the sampling voltage Vsh1a and Vsh1b can be reduced by the same ratio, the resistance values of the resistors 153d and 153e are the same, and the resistance values of the resistors 153d and 153e are double the resistance values of the resistors 153b and 153c. With this configuration, as shown in FIG. 10, the subtraction circuit 153 outputs the difference (Vh0+Vh1) between the sampling voltages Vsh1a and Vsh1b as the sampling voltage Vsh1. By doing so, the offset voltage Vos is cancelled out by the subtraction circuit 153.

The correction voltage output circuit 122 includes only the variable power supply 122a out of the component elements of the correction voltage output circuit 122 in the current measuring apparatus 101, and the variable power supply 122a is constructed so as to output the DC voltage Vdc with the voltage value −Vr. Accordingly, in the current measuring apparatus 101A, as shown in FIG. 10 the correction voltage output circuit 122 outputs a DC voltage Vdc with the voltage value −Vr as the correction voltage Vco.

In the current measuring apparatus 101A, the adder circuit 125 adds the sampling voltage Vsh1 (=Vh0+Vh1) outputted from the offset cancelling circuit 141 and the correction voltage Vco (=−Vr) outputted from the correction voltage output circuit 122 and outputs the corrected Hall voltage Vhco (=α×(Vh0+Vh1−Vr)).

Accordingly, with the current measuring apparatus 101A also, the operator of the current measuring apparatus 101A is capable, by executing the correction voltage setting process (a process that sets the voltage value Vr of the correction voltage Vco) in a state where a magnetic field from the detected object is not applied to the Hall element 102 (that is, a state where the Hall voltage Vh0 is zero) and adjusting the voltage value −Vr of the DC voltage Vdc outputted from the variable power supply 122a so that the Hall voltage Vhco described above becomes zero, of producing a state where (Vh1−Vr)=0. That is, it is possible to output the Hall voltage Vhco in which the Hall voltage Vh1 has been substantially cancelled out while avoiding saturation in the adder circuit 125 due to the presence of the Hall voltage Vh1.

Figure 11:
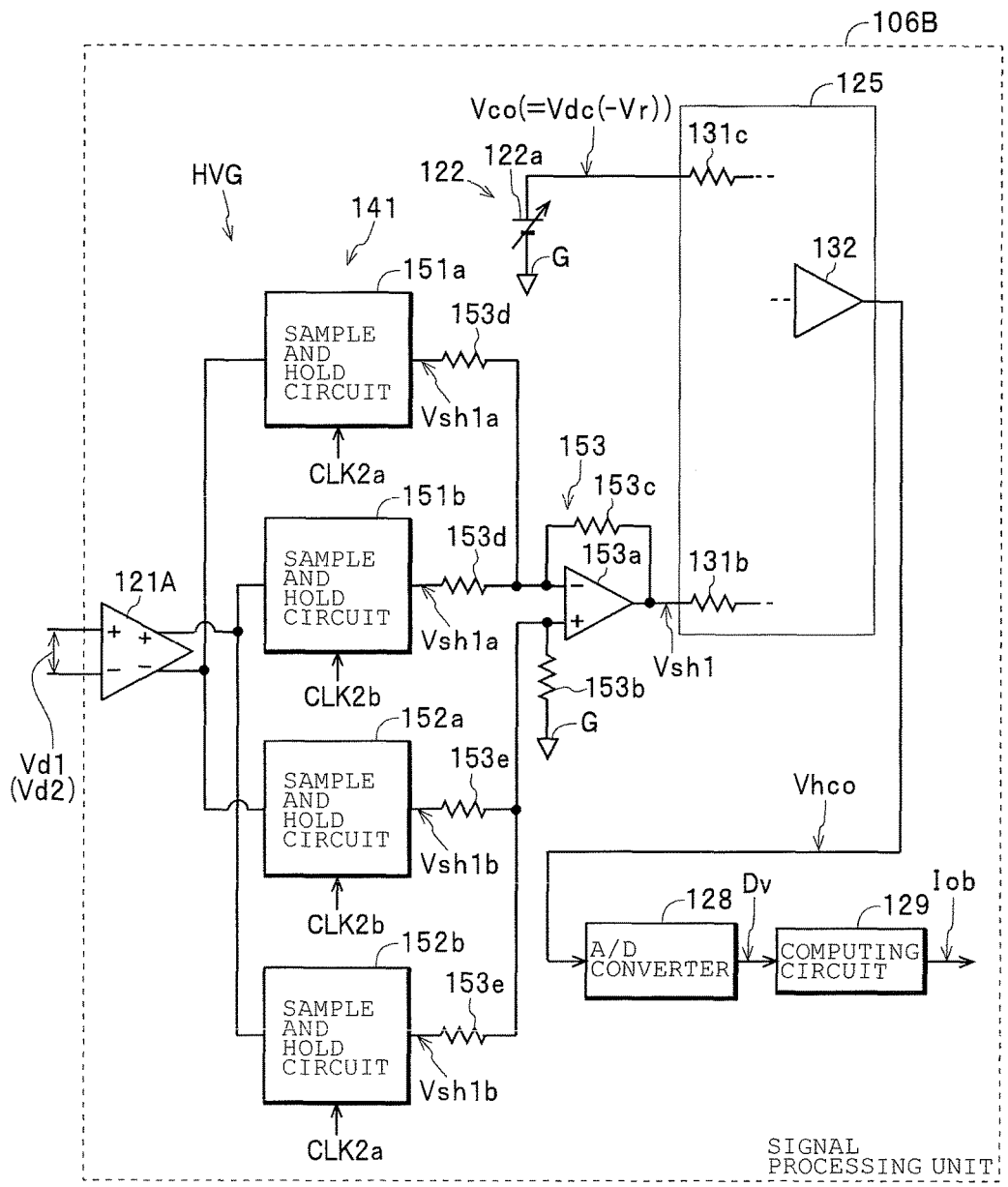
FIG. 11 is a block diagram of yet another current measuring apparatus.

Also, although the signal processing unit 106 and 106A that use the non-differential output-type differential amplifier 121 are used in the examples described above, like the current measuring apparatus 101B shown in FIG. 11, it is also possible to use a signal processing unit 106B that uses a differential output-type differential amplifier 121. Also, as shown in FIG. 11, with a signal processing unit 106B of this configuration, the same configuration as the sample and hold circuits 151 and 152 in the offset cancelling circuit 141 of the signal processing unit 106A is used for the pairs of output terminals of the differential amplifier 121A, with one output terminal out of the pair of output terminals being connected to the sample and hold circuits 151a and 152a and the other output terminal being connected to the sample and hold circuits 151b and 152b. In the subtraction circuit 153, the difference between the combined voltage of the sampling voltages Vsh1a outputted from the sample and hold circuits 151a and 151b and the combined voltage of the sampling voltages Vsh1b outputted from the sample and hold circuits 152a and 152b is detected and outputted as the sampling voltage Vsh1. By doing so, the offset voltage Vos is cancelled out by the subtraction circuit 153. Note that configurations that are the same as the current measuring apparatus 101A have been assigned the same reference numerals and duplicated description thereof is omitted.

Figure 12:
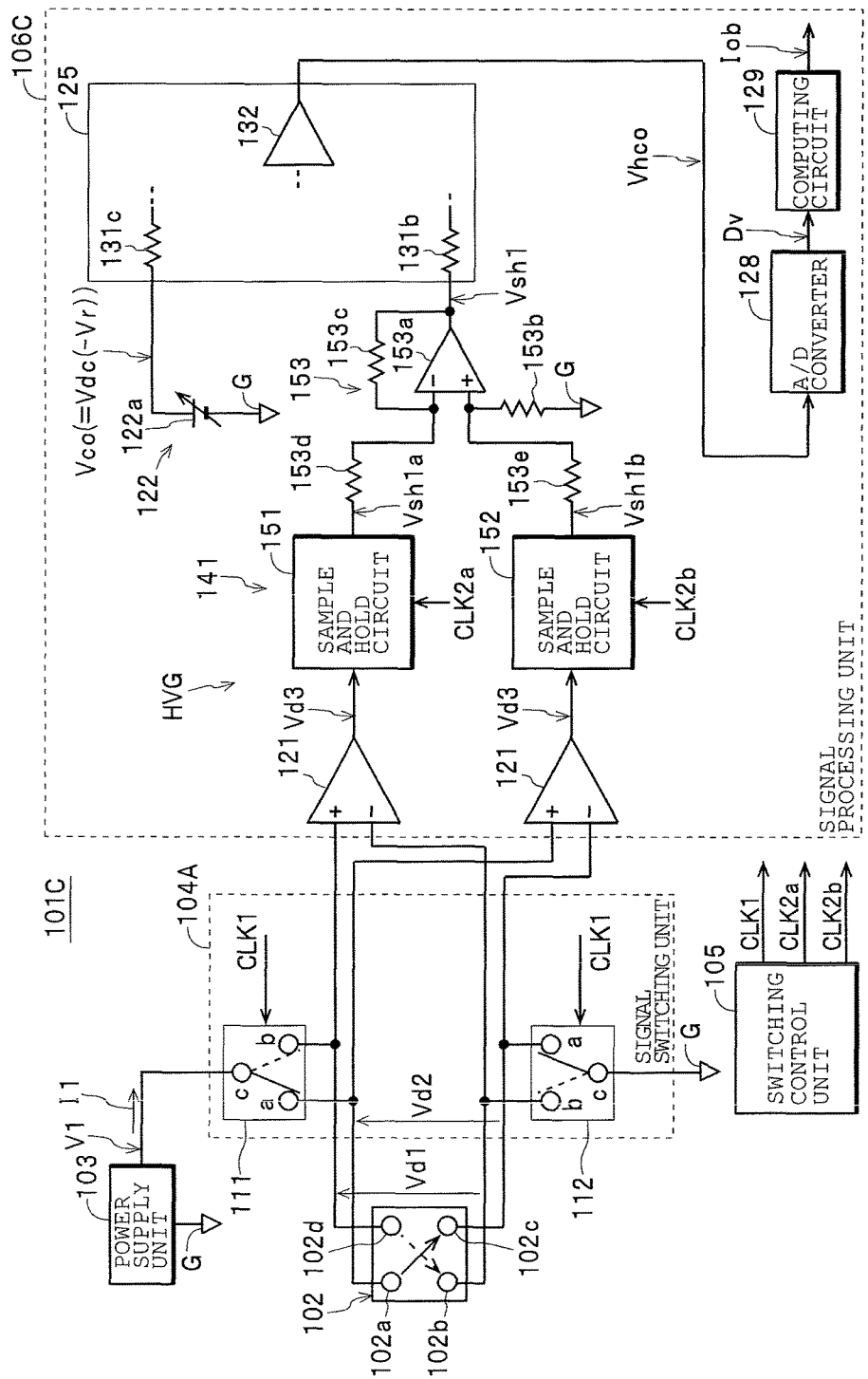
FIG. 12 is a block diagram of yet another current measuring apparatus.

Also, as shown in FIGS. 7 and 9, although the current measuring apparatuses 101, 101A, and 110B described above include the signal switching unit 104 with a configuration where the first detection voltage Vd1 and the second detection voltage Vd2 outputted from the terminal pairs of the Hall element 102 are switched by the switches 113 and 114 and outputted to the differential amplifier 121 (121A) of one of the signal processing units 106, 106A, and 106B, like the signal processing unit 106C of the current measuring apparatus 101C shown in FIG. 12, it is also possible, when using a signal processing unit where dedicated differential amplifiers 121, 121 are disposed before the two sample and hold circuits 151 and 152, to use a signal switching unit 104A that omits the switches 113 and 114 as shown in FIG. 12. Note that the same configurations as the current measuring apparatuses 101 and 101A have been assigned the same reference numerals and duplicated description thereof is omitted.

Note that although not shown, like the signal processing unit 106B of the current measuring apparatus 101B shown in FIG. 11, for a configuration that uses the differential output-type differential amplifier 121A, it is also possible to use a configuration that uses two differential amplifiers 121A and the signal switching unit 104A described above.

It is also possible to use mechanical switches, relays, and semiconductor switches (transistors, FET, and the like) for the switches 111 to 114 and the switches 122b and 126b. Also, although not shown, it is also possible to use a core material that guides a magnetic field from the detected object to the Hall element 102.

NUMERICAL REFERENCES 1, 1A Hall element driving circuit
2, 2A signal switching unit
3 switching unit
4 switching control unit
5 Hall element
5a, 5c terminal pair
5b, 5d terminal pair
6 power supply unit
7, 7A, 7B, 7C signal processing unit
8, 8A, 8B, 8C sensor circuit
101, 101A, 101B, 101C current measuring apparatus
102 Hall element
102a, 102c first terminal pair
102b, 102d second terminal pair
103 power supply unit
104, 104A signal switching unit
106, 106A, 106B, 106C signal processing unit
121, 121A differential amplifier
122 correction voltage output circuit
122a variable power supply
122b switch
122c capacitor
125 adder circuit
128 A/D converter
129 computing circuit
HVG Hall voltage generating circuit
I1 driving current
Vco correction voltage
Vd1 first detection voltage
Vd2 second detection voltage
Vd3 third detection voltage
Vh Hall voltage
Vhco corrected Hall voltage
Vos offset voltage
Vr voltage value

What is claimed is:
1. A Hall element driving circuit, comprising:
a signal switch that is disposed between a power switch, which outputs a driving current supplied from a power supply to a Hall element that includes a first terminal pair and a second terminal pair, and the Hall element, and carries out switching control over one switching state between a first switching state that supplies the driving current to the first terminal pair and a second switching state that supplies the driving current to the second terminal pair; and
a switching controller that controls transitions from the first switching state to the second switching state of the signal switch and transitions from the second switching state to the first switching state,
wherein the power switch is disposed between the power supply and the signal switch and controls switching to one state out of an on state that connects the signal switch to the power supply, where outputting of the driving current from the power supply to the signal switch is permitted, and an off state that connects the signal switch to ground, where outputting of the driving current from the power supply to the signal switch is prevented, and
wherein the switching controller controls transitions of the power switch from the on state to the off state and transitions of the power switch from the off state to the on state, and executes switching control over the signal switch only during a period where the power switch has made a transition to the off state.
2. A sensor circuit, comprising:
the Hall element driving circuit according to claim 1; and
a signal processor that carries out signal processing on a first detection voltage produced between the second terminal pair during the first switching state and a second detection voltage produced between the first terminal pair during the second switching state to detect a Hall voltage of the Hall element in which an offset voltage of the Hall element has been cancelled out.

* * * * *